US009472293B2

(12) United States Patent
Nagatsuka et al.

(10) Patent No.: US 9,472,293 B2
(45) Date of Patent: Oct. 18, 2016

(54) METHOD FOR DRIVING SEMICONDUCTOR DEVICE AND SEMICONDUCTOR DEVICE

(71) Applicant: Semiconductor Energy Laboratory Co., Ltd., Atsugi-shi, Kanagawa-ken (JP)

(72) Inventors: Shuhei Nagatsuka, Kanagawa (JP); Hiroki Inoue, Kanagawa (JP); Takahiko Ishizu, Kanagawa (JP); Takanori Matsuzaki, Kanagawa (JP); Yutaka Shionoiri, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/990,908

(22) Filed: Jan. 8, 2016

(65) Prior Publication Data

US 2016/0203871 A1    Jul. 14, 2016

Related U.S. Application Data

(63) Continuation of application No. 14/200,430, filed on Mar. 7, 2014, now Pat. No. 9,240,244.

(30) Foreign Application Priority Data

Mar. 14, 2013   (JP) ................................. 2013-051141

(51) Int. Cl.
*G11C 16/08* (2006.01)
*G11C 16/24* (2006.01)
*G11C 16/04* (2006.01)

(52) U.S. Cl.
CPC ............... *G11C 16/24* (2013.01); *G11C 16/04* (2013.01); *G11C 16/045* (2013.01); *G11C 16/0408* (2013.01); *G11C 16/0441* (2013.01)

(58) Field of Classification Search
CPC ........................................................ G11C 16/04
USPC ........................................................ 365/185.1
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Son Mai
(74) *Attorney, Agent, or Firm* — Fish & Richardson P.C.

(57) ABSTRACT

To read multilevel data from a memory cell having a transistor using silicon and a transistor using an oxide semiconductor, without switching a signal for reading the multilevel data in accordance with the number of the levels of the multilevel data. The potential of the bit line is precharged, the electrical charge of the bit line is discharged via a transistor for writing data, and the potential of the bit line which is changed by the discharging is read as multilevel data. With such a structure, the potential corresponding to data held in a gate of the transistor can be read by only one-time switching of a signal for reading data.

12 Claims, 20 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,856,534 B2 | 2/2005 | Rodriguez et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,339,828 B2 | 12/2012 | Yamazaki et al. |
| 8,358,530 B2 | 1/2013 | Kamata |
| 8,363,452 B2 | 1/2013 | Yamazaki et al. |
| 8,411,480 B2 | 4/2013 | Nagatsuka et al. |
| 8,520,426 B2 | 8/2013 | Ohnuki |
| 8,542,528 B2 | 9/2013 | Sekine et al. |
| 8,569,753 B2 | 10/2013 | Isobe et al. |
| 8,614,916 B2 | 12/2013 | Nagatsuka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0194327 A1 | 8/2011 | Kawae |
| 2011/0194331 A1 | 8/2011 | Kawae et al. |
| 2011/0228584 A1* | 9/2011 | Takemura .......... G11C 16/0483 365/185.1 |
| 2012/0032164 A1 | 2/2012 | Ohnuki |
| 2012/0063206 A1 | 3/2012 | Furutani et al. |
| 2012/0153276 A1 | 6/2012 | Kamata |
| 2012/0275245 A1 | 11/2012 | Sekine et al. |
| 2012/0287700 A1 | 11/2012 | Takemura |
| 2012/0294070 A1 | 11/2012 | Matsuzaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-342888 A | 12/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181167 A | 9/2011 |
| JP | 2011-181911 A | 9/2011 |
| JP | 2011-227981 A | 11/2011 |
| JP | 2012-252770 A | 12/2012 |
| JP | 2012-256400 A | 12/2012 |
| JP | 2013-008435 A | 1/2013 |
| KR | 2012-0124471 A | 11/2012 |
| KR | 2012-0125320 A | 11/2012 |
| KR | 2013-0057423 A | 5/2013 |
| WO | WO-2004/114391 | 12/2004 |
| WO | WO-2011/096264 | 8/2011 |

(56) References Cited

FOREIGN PATENT DOCUMENTS

| WO | WO-2011/096277 | 8/2011 |
|---|---|---|
| WO | WO-2011/114905 | 9/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letter, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphoius In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Digest of Techical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 International Symposium Digest of Technical Papers, May 31, 2009, pp. 983-985.

Kanno.H et al., "White Stacked Electrophosphorecent Organic Light-Emitting Devices Emploting MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applicaitons", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 ands Sc2O3—A2O3—Bo Systems [A; Fe, Ga, or Al, B; Mg, Mn, Fe, Ni, Cu, or Zn] Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/056088) Dated Jun. 17, 2014.

Written Opinion (Application No. PCT/JP2014/056088) Dated Jun. 17, 2014.

\* cited by examiner

FIG. 17A
FIG. 17B
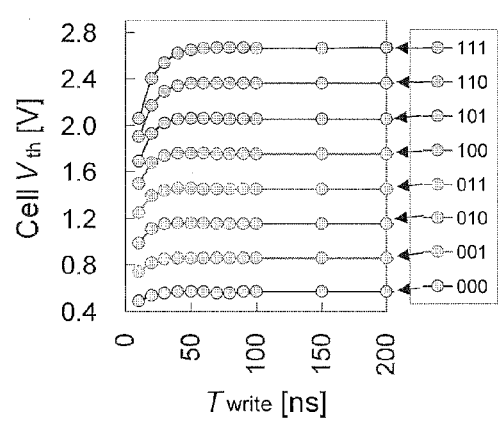
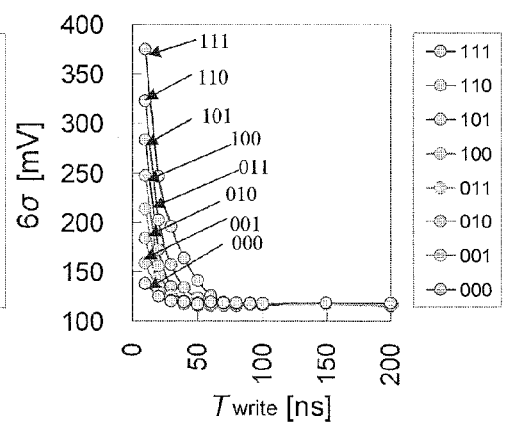

METHOD FOR DRIVING SEMICONDUCTOR DEVICE AND SEMICONDUCTOR DEVICE

CROSS-REFERENCE TO RELATED APPLICATIONS

This application is a continuation of U.S. application Ser. No. 14/200,430, filed Mar. 7, 2014, now allowed, which claims the benefit of a foreign priority application filed in Japan as Serial No. 2013-051141 on Mar. 14, 2013, both of which are incorporated by reference.

TECHNICAL FIELD

The present invention relates to a method for driving a semiconductor device.

BACKGROUND ART

A semiconductor device capable of holding data that includes a transistor whose semiconductor layer is formed using silicon (Si) and a transistor whose semiconductor layer is formed using an oxide semiconductor (OS) has attracted attention (see Patent Document 1).

In recent years, with the increase in the amount of data manipulated, a semiconductor device having a large storage capacity has been required. In such situations, the semiconductor device disclosed in Patent Document 1 has a structure in which multilevel data is stored and read.

REFERENCE

Patent Document

[Patent Document 1] Japanese Published Patent Application No. 2012-256400

DISCLOSURE OF INVENTION

In the case where multilevel data is read from a memory cell, a signal for reading data needs to be switched two or more times in accordance with the number of levels of the multilevel data.

For example, in the semiconductor device disclosed in Patent Document 1, a read signal having a step-like waveform is supplied to a memory cell. The number of steps of the waveform corresponds to the number of levels of multilevel data. The data is read by determining change of data to be read. In such a structure, the larger the number of the levels of the multilevel data is, the larger the number of times the voltage level of the read signal needs to be switched; accordingly, reading of data takes a long time.

An object of one embodiment of the present invention is to provide a method for driving a semiconductor device having a novel structure. In the semiconductor device, a transistor using silicon and a transistor using an oxide semiconductor are provided in a memory cell. Multilevel data can be read from the memory cell without switching a signal for reading the multilevel data in accordance with the number of levels of the multilevel data.

In one embodiment of the present invention, the potential of a bit line is precharged, the electrical charge of the bit line is discharged via a transistor for reading data, and the potential of the bit line which has been changed by the discharging is read as multilevel data. With such a structure, the potential corresponding to data held in a gate of the transistor can be read by only one-time switching of a signal for reading data.

In a structure according to one embodiment of the present invention, the following phenomenon is used: by the discharging of the potential of a bit line, the voltage held between a gate and a source of a transistor reaches the threshold voltage of the transistor. Here, the gate of the transistor for reading data has a potential corresponding to multilevel data, and the source has the potential of the bit line. Thus, by the above-described discharging of the potential of the bit line, the potential of the bit line reaches a value obtained by subtracting the threshold voltage from the potential corresponding to multilevel data. By reading the potential of the bit line, the potential corresponding to the multilevel data can be obtained.

One embodiment of the present invention is a method for driving a semiconductor device including a memory cell in which a plurality of pieces of data is written by holding a potential based on the data supplied to a gate of a second transistor via a first transistor, including the steps of precharging the potential of a bit line electrically connected to the second transistor and discharging the potential of the bit line via the second transistor after the precharging, so that the data is read.

Another embodiment of the present invention is a method for driving a semiconductor device including a memory cell in which a plurality of pieces of data is written by holding a potential based on the data supplied to a gate of a second transistor via a first transistor, including the steps of precharging the potential of the bit line electrically connected to the second transistor, discharging the potential of the bit line via the second transistor after the precharging, and determining the data using the potential of the bit line that is changed by the discharging, so that the data is read.

Another embodiment of the present invention is a method for driving a semiconductor device including a memory cell in which a plurality of pieces of data is written by holding a potential based on the data supplied to a gate of a second transistor via a first transistor and the data is read by electrically connecting one electrode of a capacitor to the gate of the second transistor and by supplying a read signal to another electrode of the capacitor, including the steps of precharging the potential of the bit line electrically connected to the second transistor, discharging the potential of the bit line via the second transistor after the precharging by changing a level of the read signal from a high level to a low level, and determining the data using the potential of the bit line that is changed by the discharging.

In the method for driving a semiconductor device in one embodiment of the present invention, the data is preferably written in a state where the read signal is changed from a high level to a low level.

In the method for driving a semiconductor device in one embodiment of the present invention, the first transistor preferably includes an oxide semiconductor in a semiconductor layer.

In the method for driving a semiconductor device in one embodiment of the present invention, the second transistor is preferably a p-channel transistor.

One embodiment of the present invention can provide a method for driving a semiconductor device having a novel structure in which multilevel data can be read from the memory cell without switching a signal for reading the multilevel data in accordance with the number of levels of the multilevel data.

BRIEF DESCRIPTION OF DRAWINGS

FIG. 17A shows the relationship between $V_{th}$ and write time, and FIG. 17B shows the relationship between 6σ of a cell threshold voltage and write time.

BEST MODE FOR CARRYING OUT THE INVENTION

Figure 1A:
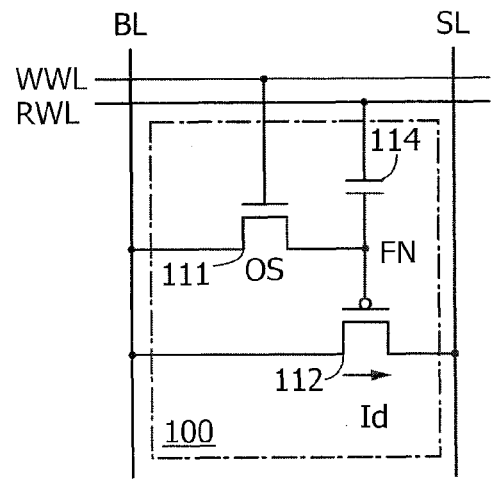
FIG. 1A is a circuit diagram of a memory cell.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, the embodiments are not necessarily limited to such a scale. Note that the drawings are schematic views showing ideal examples, and the embodiments are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relation between components with reference to drawings. Further, the positional relation between components is changed as appropriate in accordance with a direction in which each component is described. Thus, there is no limitation on terms used in this specification, and description can be made appropriately depending on the situation.

Note that the layout of circuit blocks in drawings specifies the positional relation for description. Thus, even when a drawing shows that different functions are achieved in different circuit blocks, an actual circuit or region may be configured so that the different functions are achieved in the same circuit or region. In addition, functions of circuit blocks in diagrams are specified for description, and even in the case where one circuit block is illustrated, blocks may be provided in an actual circuit or region so that processing performed by one circuit block is performed by a plurality of circuit blocks.

Note that a voltage refers to a potential difference between a given potential and a reference potential (e.g., a ground potential) in many cases. Accordingly, the voltage, the potential, and the potential difference can also be referred to as a potential, a voltage, and a voltage difference, respectively. Note that a voltage refers to the difference between potentials of two points, and a potential refers to electrostatic energy (electric potential energy) of a unit charge at a given point in an electrostatic field.

In this specification, embodiments and an example of the present invention will be described with reference to the drawings. The embodiments and the example are described in the following order:

1. Embodiment 1 (memory cell according to one embodiment of the present invention)
2. Embodiment 2 (configuration example of semiconductor device)
3. Embodiment 3 (oxide semiconductor)
4. Embodiment 4 (elements of semiconductor device)
5. Embodiment 5 (structure examples of electronic components of semiconductor device and electronic devices including electronic components)
6. Example (fabricated semiconductor device)

Embodiment 1

In this embodiment, a circuit configuration and operation of a memory cell included in a semiconductor device according to one embodiment of the invention to be disclosed will be described with reference to FIGS. 1A and 1B.

Note that a semiconductor device refers to a device including a semiconductor element. The semiconductor device includes a driver circuit or the like for driving a circuit including a semiconductor element. Note that a semiconductor device includes a memory cell, and in some cases, further includes a driver circuit, a power supply circuit, or the like provided over a substrate which is different from a substrate provided with the memory cell.

FIG. 1A is a circuit diagram showing an example of a memory cell 100.

The memory cell 100 shown in FIG. 1A includes a transistor 111, a transistor 112, and a capacitor 114. Note that in the actual case, a plurality of memory cells 100 is arranged in a matrix, though not shown in FIG. 1A.

A gate of the transistor 111 is connected to a write word line WWL. One of a source and a drain of the transistor 111 is connected to a bit line BL. The other of the source and the drain of the transistor 111 is connected to a floating node FN.

A gate of the transistor 112 is connected to the floating node FN. One of a source and a drain of the transistor 112 is connected to the bit line BL. The other of the source and the drain of the transistor 112 is connected to a power supply line SL.

One electrode of the capacitor 114 is connected to the floating node FN. The other electrode of the capacitor 114 is connected to a read word line RWL.

A word signal is supplied to the write word line WWL.

The word signal is a signal which turns on the transistor 111 so that the voltage of the bit line BL is supplied to the floating node FN.

Note that in this specification, "writing of data to the memory cell" means that a word signal supplied to the write word line WWL is controlled so that the potential of the floating node FN reaches a potential corresponding to the voltage of the bit line BL. Further, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Further, a precharge voltage $V_{precharge}$ for reading data and an initialization voltage $V_{initial}$ are supplied to the bit line BL.

The multilevel data is k-bit (k is a natural number of 2 or more) data. Specifically, 2-bit data is 4-level data, namely, a signal having any one of the four levels of voltages.

The precharge voltage $V_{precharge}$ is a voltage which is supplied to the bit line BL to perform reading of data. After the precharge voltage $V_{precharge}$ is supplied, the bit line BL is brought into an electrically floating state.

Note that in this specification, "electrically floating state" refers to a state of being isolated electrically, i.e., being not connected electrically to a wiring to which a signal is applied or a wiring to which a potential is applied.

The initialization voltage $V_{initial}$ is a voltage which is supplied to initialize the voltage of the bit line BL.

A read signal is supplied to the read word line RWL.

The read signal is a signal which is supplied to the other electrode of the capacitor 114 to perform reading of data from the memory cell in a selective manner.

The floating node FN corresponds to any node on a wiring which connects one electrode of the capacitor 114, the other of the source and the drain of the transistor 111, and the gate of the transistor 112.

Note that in this specification, "node" refers to any point on a wiring provided to connect elements electrically.

Note that the potential of the floating node FN is based on the multilevel data supplied to the bit line BL. The floating node FN is in an electrically floating state when the transistor 111 is turned off. Thus, in the case where the voltage of the read signal supplied to the read word line RWL is changed, the potential of the floating node FN reaches a potential which is the sum of the previous potential and the amount of change in the voltage of the read signal. The change in the potential is due to capacitive coupling of the capacitor 114 which is caused by the change of the read signal supplied to the read word line RWL.

The power supply line SL is supplied with a discharge voltage $V_{discharge}$ which is lower than the precharge voltage $V_{precharge}$ supplied to the bit line BL.

The discharge voltage $V_{discharge}$ is supplied to the power supply line SL to change the precharge voltage $V_{precharge}$ supplied to the bit line BL by discharging via the transistor 112.

The transistor 111 has a function of a switch for controlling writing of data by being switched between a conducting state and a non-conducting state. The transistor 111 also has a function of holding a potential based on written data by keeping a non-conducting state. Note that the transistor 111 is also referred to as a first transistor. Further, the transistor 111 is an re-channel transistor in the description.

Note that, as the transistor 111, a transistor having a low current (low off-state current) which flows between a source and a drain in a non-conducting state is preferably used. Here, the "low off-state current" means that the normalized off-state current per micrometer of a channel width with a drain-source voltage of 10 V at room temperature is less than or equal to 10 zA. An example of a transistor having such a low off-state current is a transistor including an oxide semiconductor as a semiconductor layer.

In the configuration of the memory cell 100 shown in FIG. 1A, a potential based on written data is held by keeping the non-conducting state. Thus, it is particularly preferable to use a transistor with a low off-state current as a switch for suppressing change in the potential in the floating node FN which is accompanied by the transfer of electrical charge.

When a transistor having a low off-state current is used as the transistor 111 and the transistor 111 is kept turned off, the memory cell 100 can be a non-volatile memory. Thus, once data is written to the memory cell 100, the data can be held in the floating node FN until the transistor 111 is turned on again.

In the transistor 112, a current $I_d$ flows between the source and the drain in accordance with the potential of the floating node FN. Note that in the memory cell 100 shown in FIG. 1A, the current $I_d$ that flows between the source and the drain of the transistor 112 is a current that flows between the bit line BL and the power supply line SL. Note that the transistor 112 is also referred to as a second transistor. Further, the transistor 112 is a p-channel transistor in the description.

The transistor 112 preferably has little variation in threshold voltage. Here, transistors with little variation in threshold voltage mean as follows: transistors produced in the same process have an acceptable difference in threshold voltage of 20 mV or lower, examples of which are transistors including single crystal silicon in channels. It is needless to say that the variation in threshold voltage is preferably as little as possible; however, even the transistors including single crystal silicon in channels may have a difference in threshold voltage of approximately 20 my.

Next, the operation of the memory cell 100 shown in FIG. 1A is described, and further, the action and effect of the structure of this embodiment are described.

Figure 1B:
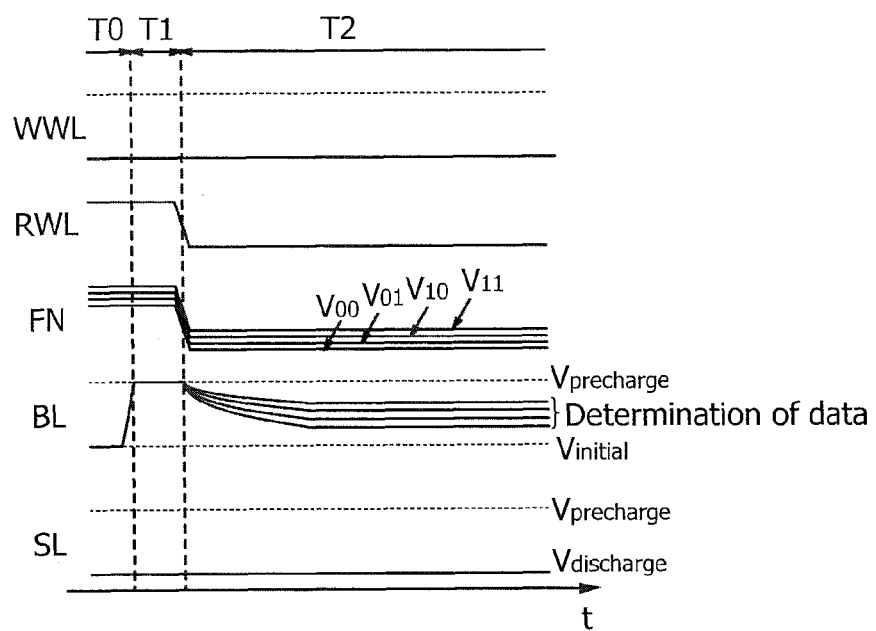
FIG. 1B is a timing chart of the memory cell.

FIG. 1B is a timing chart illustrating change of signals supplied to the write word line WWL, the read word line RWL, the floating node FN, the bit line BL, and the power supply line SL which are shown in FIG. 1A.

The following periods are shown in the timing chart of FIG. 1B: a period T0 which is in an initial state; a period T1 in which the potential of the bit line BL is precharged; and a period T2 in which the electrical charge of the bit line BL is discharged to perform reading of data.

In the period T0 of FIG. 1B, the potential of the bit line BL is initialized. At this time, the write word line WWL is supplied with a low-level potential, and the read word line RWL is supplied with a high-level potential. The floating node FN holds a potential corresponding to the multilevel data. The bit line BL is supplied with an initialization voltage $V_{initial}$. The power supply line SL is supplied with a discharge voltage $V_{discharge}$.

Note that as an example of the multilevel data, 2-bit data, i.e., 4-level data is shown in FIG. 1B. Specifically, 4-level data ($V_{00}$, $V_{01}$, $V_{10}$, and $V_{11}$) are shown in FIG. 1B, and the data can be represented by four levels of potentials.

Next, in the period T1 of FIG. 1B, the potential of the bit line BL is precharged. At this time, the write word line WWL is supplied with the low-level potential as in the previous period. The read word line RWL is supplied with the high-level potential as in the previous period. In the floating node FN, the potential corresponding to the multi-level data is held as in the previous period. The bit line BL is supplied with a precharge voltage $V_{precharge}$. The power supply line SL is supplied with the low-level potential, which is lower than the precharge voltage $V_{precharge}$, as in the previous period.

At this time, the bit line BL is brought into an electrically floating state after the precharge voltage $V_{precharge}$ is supplied. That is, the bit line BL is brought into a state in which the potential is changed by the charging or discharging of electrical charge. The floating state can be achieved by turning off a switch for supplying a potential to the bit line BL.

Next, in the period T2 of FIG. 1B, the electrical charge of the bit line BL is discharged to perform data reading. At this time, the write word line WWL is supplied with the low-level potential as in the previous period. The read word line RWL is supplied with the low-level potential. In the floating node FN, each of the potentials corresponding to the mul-tilevel data is lowered. In the bit line BL, the voltage is lowered from the precharge voltage $V_{precharge}$ in accordance with the potential of the floating node FN. The power supply line SL is supplied with the discharge voltage $V_{discharge}$ as in the previous period.

The potential of the floating node FN is lowered in accordance with the change in the potential of the read word line RWL. The lowering of the potential is derived from the electrically floating state of the floating node FN and is caused by capacitive coupling due to the capacitor 114 connected to the floating node FN.

The lowering of the floating node FN leads to a decrease in the potential of the gate of the transistor 112. The transistor 112 is a p-channel transistor, and the absolute value of a voltage between the gate and the source (gate-source voltage: $V_{gs}$) is increased as the potential of the gate is lowered. With the increase in $V_{gs}$, the current $I_d$ flows between the source and the drain of the transistor 112.

When the current $I_d$ flows in the transistor 112, the electrical charge of the bit line BL is discharged to the power supply line SL. The potential of the bit line BL corresponding to the source of the transistor 112 is lowered by the discharging. The lowering of the potential of the bit line BL leads to a gradual decrease in $V_{gs}$ of the transistor 112.

When $V_{gs}$ reaches the threshold voltage of the transistor 112, the current $I_d$ that flows in the period T2 stops flowing. Hence, the lowering of the potential of the bit line BL proceeds, and when $V_{gs}$ of the transistor 112 reaches the threshold voltage, the discharging is completed and the bit line BL has a constant potential. The potential of the bit line BL at this time is approximately a value obtained by subtracting the threshold voltage from the potential of the floating node FN.

That is, the potential of the floating node FN can be reflected in the potential of the bit line BL which is changed by the discharging. The difference in the potential is used to determine the multilevel data. In this manner, the multilevel data written to the memory cell 100 can be read.

In this embodiment, the multilevel data can be read from the memory cell without switching a signal for reading data in accordance with the number of levels of the multilevel data.

The structure described above in this embodiment can be combined as appropriate with any of the structures described in the other embodiments.

Embodiment 2

In this embodiment, an example of a semiconductor device which can be driven by the method illustrated in FIGS. 1A and 1B is described. Description below is made with reference to FIG. 2 to FIG. 8.

<Configuration Example of Semiconductor Device>

Figure 2:
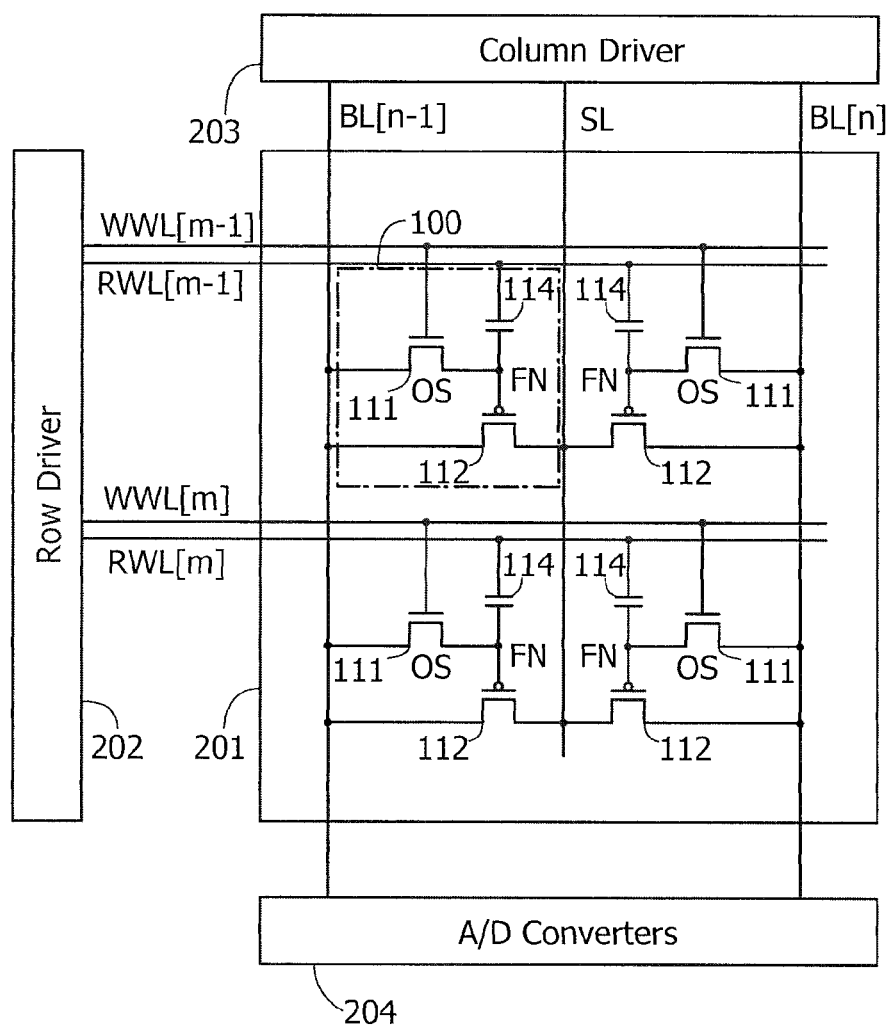
FIG. 2 is a circuit block diagram of a semiconductor device.

FIG. 2 is a block diagram showing a configuration example of a semiconductor device including the memory cell 100 shown in FIG. 1A.

A semiconductor device 200 shown in FIG. 2 includes a memory cell array 201 provided with a plurality of memory cells 100 shown in FIG. 1A, a row driver 202, a column driver 203, and A/D converters 204. Note that in the semiconductor device 200, the memory cells 100 are arranged in a matrix of m rows and n columns. Further, in FIG. 2, a write word line WWL[m−1] and a read word line RWL[m−1] for an (m−1)th row, a write word line WWL[m] and a read word line RWL[m] for an mth row, a bit line BL[n−1] for an (n−1)th column, a bit line BL[n] for an nth column, and a power supply line SL are shown as write word lines WWL, read word lines RWL, a bit line BL, and a power supply line SL.

In the memory cell array 201 shown in FIG. 2, the memory cells 100 illustrated in FIG. 1A are arranged in a matrix. Note that components of the memory cells 100 are similar to the components of the memory cell shown in FIG. 1A; thus, the description of the components is omitted and the description of FIGS. 1A and 1B can be referred to.

Note that the memory cell array 201 shown in FIG. 2 has a configuration in which the power supply line SL is shared by adjacent memory cells. With such a configuration, the area occupied by the power supply line SL is reduced. Thus, the semiconductor device with the configuration can have a high storage capacity per unit area.

The row driver 202 is a circuit having a function of turning on the transistor 111 in the memory cell 100 of each row in a selective manner and changing the potential of the floating node FN in the memory cell 100 of each row in a selective manner. Specifically, the row driver 202 is a circuit which supplies the word signal to the write word line WWL and supplies the read signal to the read word line RWL. With the row driver 202, the memory cells 100 can be selected row by row, and data can be written and read to/from the selected memory cells 100 in the semiconductor device 200.

The column driver 203 is a circuit having a function of writing data to the floating node FN in the memory cell 100 of each column in a selective manner, precharging the potential of the bit line BL, initializing the potential of the bit line BL, and bringing the bit line BL into an electrically floating state. Specifically, the column driver 203 is a circuit which supplies a potential corresponding to multilevel data to the bit line BL and supplies a precharge voltage $V_{precharge}$ and an initialization voltage $V_{initial}$ to the bit line BL through a switch. With the column driver 203, the memory cells 100 can be selected column by column, and data can be written and read to/from the selected memory cells 100 in the semiconductor device 200.

The A/D converters 204 are circuits having a function of converting the potential of the bit line BL which is an analog value into a digital value and outputting the digital value to the outside. Specifically, the A/D converters 204 include flash A/D converters. The A/D converters 204 enable the semiconductor device 200 to output, to the outside, the potential of the bit line BL that corresponds to data read from the memory cell 100.

Note that although flash A/D converters are used as the A/D converters 204 in the description, successive approximation A/D converters, multi-slope A/D converters, or delta-sigma A/D converters may be used.

<Configuration Example of Row Driver>

Figure 3:
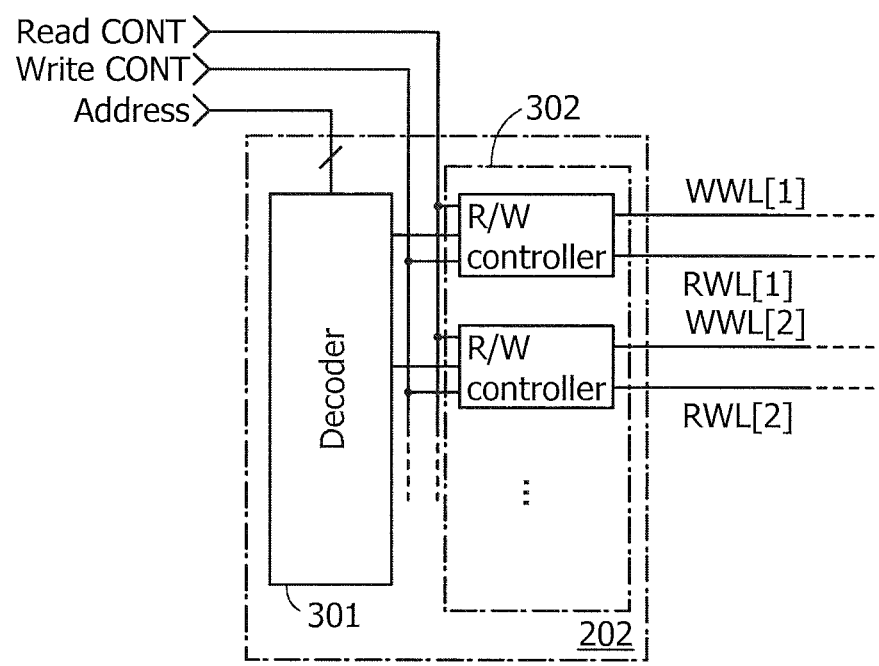
FIG. 3 is a circuit block diagram of a row driver.

FIG. 3 is a block diagram showing a configuration example of the row driver 202 illustrated in FIG. 2.

The row driver 202 shown in FIG. 3 includes a decoder 301 and read/write controllers 302. The read/write controller 302 is provided for every row of the write word line WWL and the read word line RWL. Further, the read/write controller 302 of each row is connected to the write word line WWL and the read word line RWL.

The decoder 301 is a circuit having a function of outputting a signal for selecting a row provided with the write word line WWL and the read word line RWL. Specifically, the decoder 301 is a circuit which receives an address signal (Address) and selects the read/write controller 302 of any of rows in accordance with the Address. With the decoder 301, the row driver 202 can select a given row to perform writing and reading of data.

The read/write controller 302 is a circuit having a function of outputting a write word signal and outputting a read word signal in a selective manner, in a row including the write word line WWL and the read word line RWL which are selected by the decoder 301. Specifically, the read/write controller 302 is a circuit which receives a write control signal Write_CONT and a read control signal Read_CONT and outputs a write word signal or a read word signal in accordance with the signal in a selective manner. With the read/write controllers 302, the row driver 202 can select and output the write word signal or the read word signal in the row selected by the decoder 301.

<Configuration Example of Column Driver>

Figure 4:
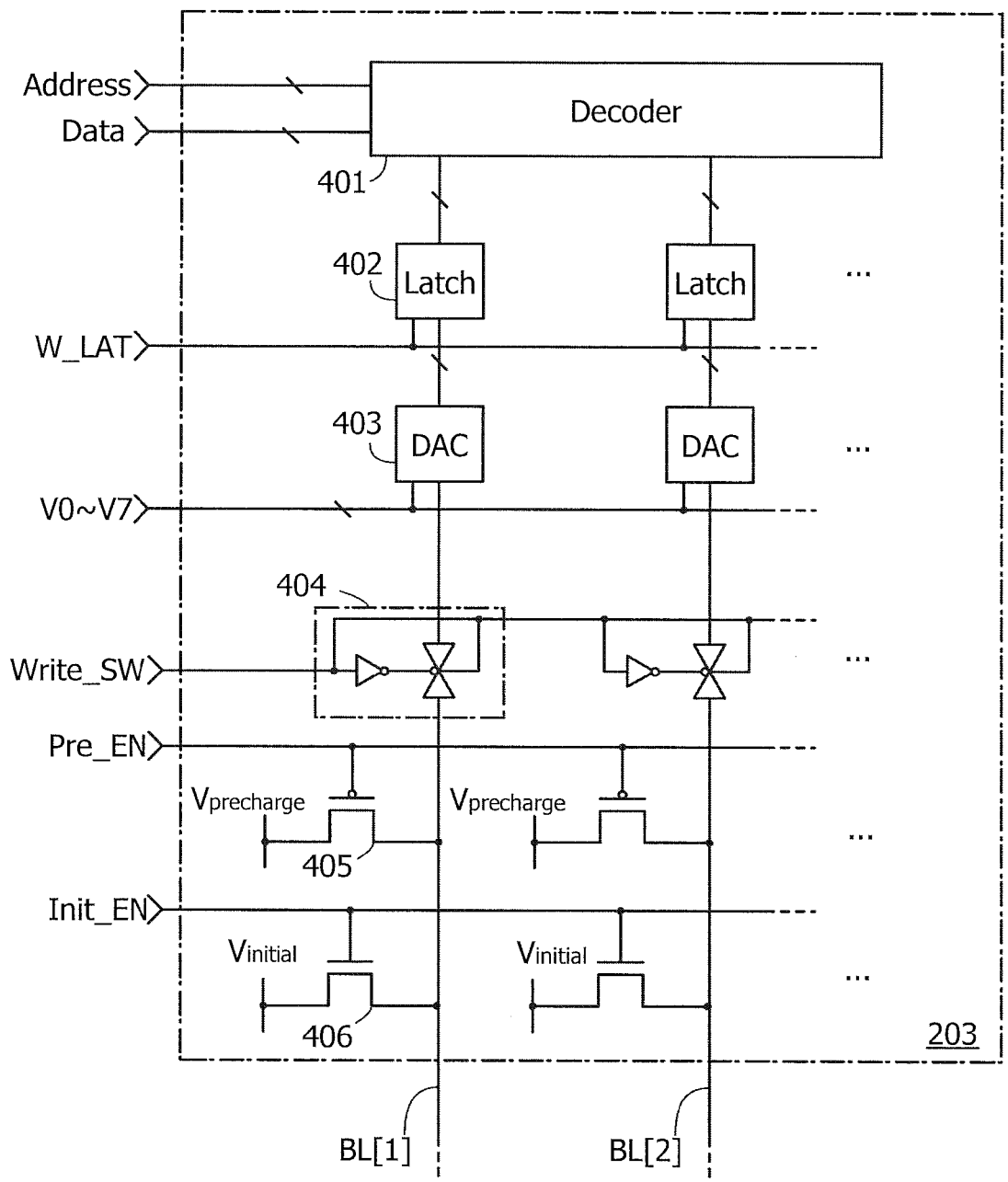
FIG. 4 is a circuit block diagram of a column driver.

FIG. 4 is a block diagram showing a configuration example of the column driver 203 illustrated in FIG. 2.

The column driver 203 shown in FIG. 4 includes a decoder 401, a latch 402, a D/A converter 403, a switch circuit 404, a transistor 405, and a transistor 406. The latch 402, the D/A converter 403, the switch circuit 404, the transistor 405, and the transistor 406 are provided for every column. Further, the switch circuit 404, the transistor 405, and the transistor 406 of each column are connected to the bit line BL.

The decoder 401 is a circuit having a function of selecting a column provided with the bit line BL and sorting and outputting input data. Specifically, the decoder 401 is a circuit which receives an address signal (Address) and data (Data) and outputs the Data to the latch 402 of any of rows in accordance with the Address. With the decoder 401, the column driver 203 can select a given column to perform writing of data.

Note that the Data input to the decoder 401 is k-bit digital data. The k-bit digital data is a signal represented by binary data of '1' or '0' for each bit. Specifically, 2-bit digital data is data represented by '00', '01', '10', and '11'.

The latch 402 is a circuit having a function of temporarily storing the input Data. Specifically, the latch 402 is a flip-flop circuit which receives a latch signal W_LAT, stores the Data in accordance with the latch signal W_LAT, and outputs the Data to the D/A converter 403. With the latch 402, the column driver 203 can perform writing of data at given timing.

The D/A converter 403 is a circuit having a function of converting input data (Data) which is a digital value into data ($V_{data}$) which is an analog value. Specifically, in the case where the number of bits of the Data is three, the D/A converter 403 converts the Data into any of eight levels of potentials ($V_0$ to $V_7$) and outputs the potential to the switch circuit 404. With the D/A converter 403, data to be written to the memory cell 100 can be changed into a potential corresponding to multilevel data, in the column driver 203.

Note that the data $V_{data}$ output from the D/A converters 403 are represented by different voltage levels. That is, 2-bit data is 4-level data (0.5 V, 1.0 V, 1.5 V, and 2.0 V), namely, data represented by any of the four voltage values.

The switch circuit 404 is a circuit having a function of supplying input data $V_{data}$ to the bit line BL and bringing the bit line BL into an electrically floating state. Specifically, the switch circuit 404 includes an analog switch and an inverter; in accordance with a switch control signal Write_SW, the data $V_{data}$ is supplied to the bit line BL, and then, the analog switch is turned off to bring the bit line BL into an electrically floating state. The switch circuit 404 enables the column driver 203 to keep the bit line BL in an electrically floating state after the data $V_{data}$ is supplied to the bit line BL.

The transistor 405 is a circuit having a function of supplying a precharge voltage $V_{precharge}$ to the bit line BL and bringing the bit line BL into an electrically floating state. Specifically, the transistor 405 is a switch which, in accordance with a precharge control signal Pre_EN, supplies a precharge voltage $V_{precharge}$ to the bit line BL and then brings the bit line BL into an electrically floating state. The transistor 405 enables the column driver 203 to keep the bit line BL in an electrically floating state after the precharge voltage $V_{precharge}$ is supplied to the bit line BL.

The transistor 406 is a circuit having a function of supplying an initialization voltage $V_{initial}$ to the bit line BL and bringing the bit line BL into an electrically floating state. Specifically, the transistor 406 is a switch which, in accordance with an initialization control signal Init_EN, supplies an initialization voltage $V_{initial}$ to the bit line BL and then brings the bit line BL into an electrically floating state. The transistor 406 enables the column driver 203 to keep the bit line BL in an electrically floating state after the initialization voltage $V_{initial}$ is supplied to the bit line BL.

<Configuration Example of A/D Converter>

Figure 5:
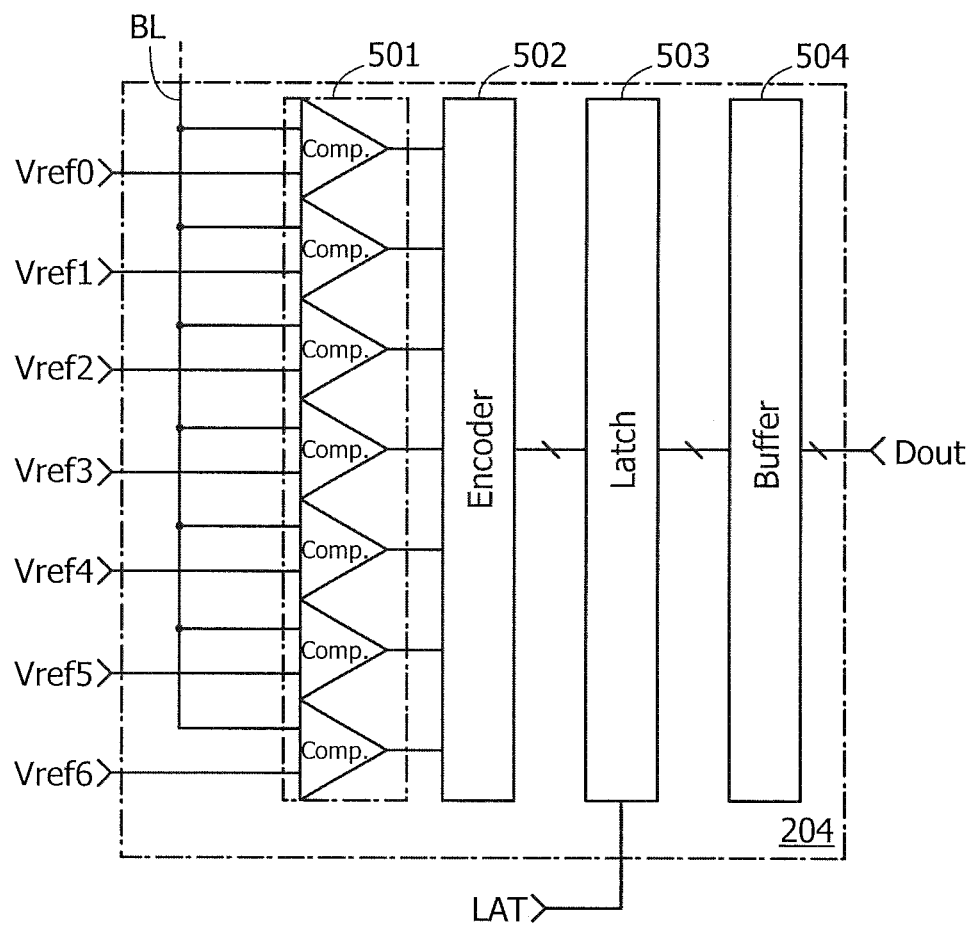
FIG. 5 is a circuit block diagram of an A/D converter.

FIG. 5 is a block diagram showing a configuration example of the A/D converter 204 illustrated in FIG. 2.

The A/D converter 204 shown in FIG. 5 includes a comparator 501, an encoder 502, a latch 503, and a buffer 504. The comparator 501, the encoder 502, the latch 503, and the buffer 504 are provided for every column. Further, the buffer 504 of each column outputs data Dout.

The comparator 501 is a circuit having a function of determining whether the potential of the bit line BL is a potential corresponding to any of levels of the multilevel data by comparing the levels of the potentials of the bit line BL and the levels of the potentials of reference voltages $V_{ref0}$ to $V_{ref6}$. Specifically, a plurality of comparators is provided, and each of the comparators is supplied with the potential of the bit line BL and the potential of any of the reference voltages $V_{ref0}$ to $V_{ref6}$ (different from each other) to determine between which two potentials of the reference voltages $V_{ref0}$ to $V_{ref6}$ the potential of the bit line BL is. With the comparator 501, the A/D converter 204 can determine whether the potential of the bit line BL is a potential corresponding to any of the levels of the multilevel data.

Note that the reference voltages $V_{ref0}$ to $V_{ref6}$ which are shown in FIG. 5 as an example are supplied when the multilevel data is 3-bit data, i.e., 8-level data.

The encoder 502 is a circuit having a function of generating a multi-bit digital signal on the basis of a signal for determining the potential of the bit line BL which is output from the comparator 501. Specifically, the encoder 502 is a circuit which generates a digital signal by performing encoding on the basis of a high-level signal or a low-level signal which is output from the plurality of comparators. With the encoder 502, the A/D converter 204 can change the data read from the memory cell 100 into data of a digital value.

The latch 503 is a circuit having a function of temporarily storing input data of a digital value. Specifically, the latch 503 is a flip-flop circuit which receives a latch signal LAT, stores data in accordance with the latch signal LAT, and outputs the data to the buffer 504. With the latch 503, the A/D converter 204 can output data at given timing. Note that the latch 503 can be omitted.

The buffer 504 is a circuit having a function of amplifying data output from the latch 503 and outputting the amplified data as an output signal Dout. Specifically, the buffer 504 is a circuit provided with an even number of inverter circuits. With the buffer 504, noises on a digital signal can be reduced in the A/D converter 204. Note that the buffer 504 can be omitted.

<Specific Example of Method for Driving Semiconductor Device>

Figure 6:
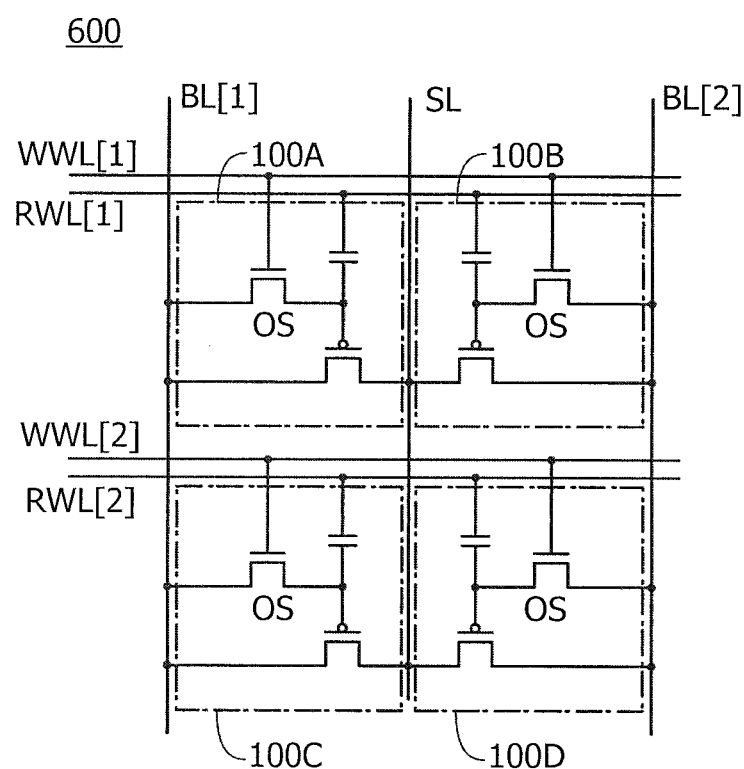
FIG. 6 is a circuit diagram of a memory cell.
Figure 7:
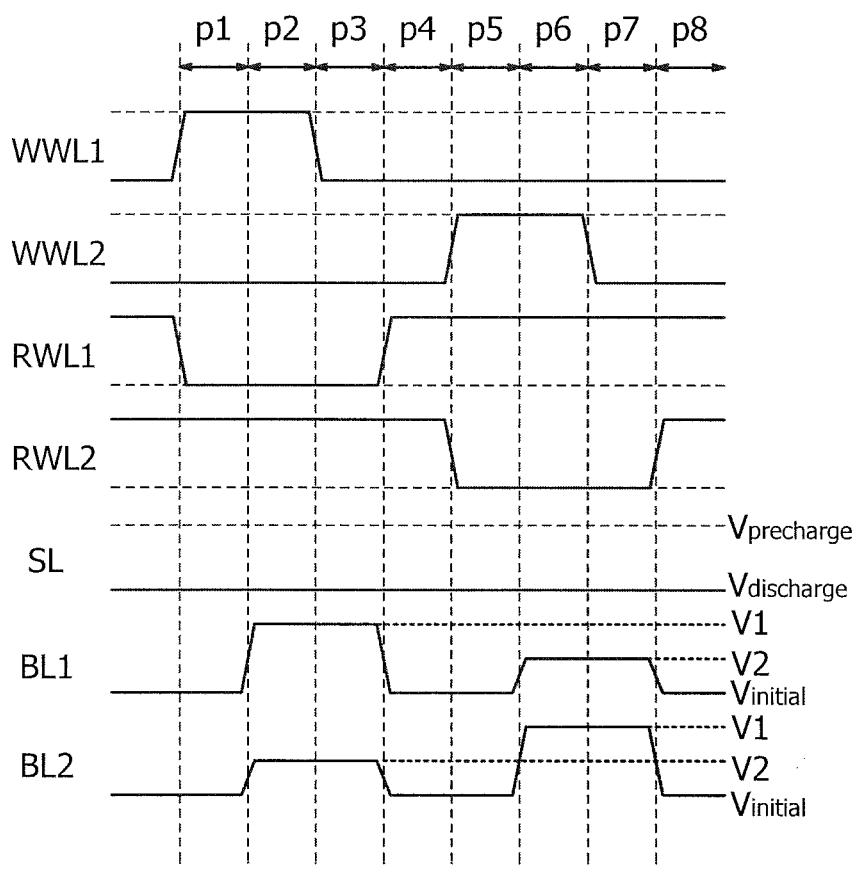
FIG. 7 is a timing chart of the memory cell.
Figure 8:
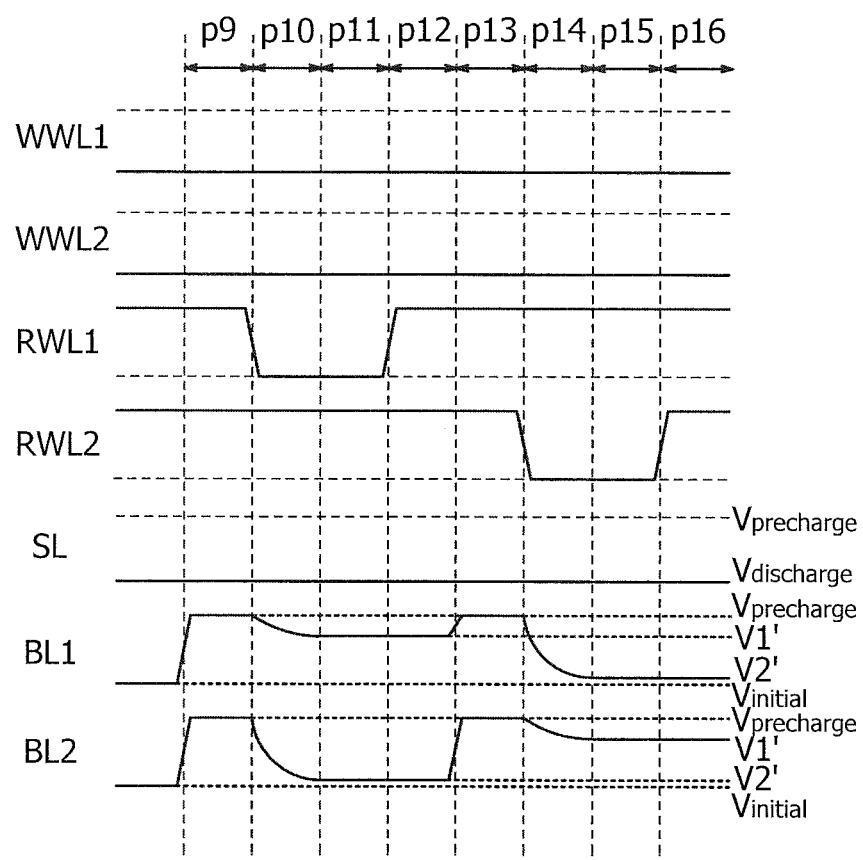
FIG. 8 is a timing chart of the memory cell.

FIG. 6 is a circuit diagram showing memory cells included in a semiconductor device. FIGS. 7 and 8 are timing charts illustrating the operations of the semiconductor device shown in FIG. 6.

A semiconductor device 600 shown in FIG. 6 includes memory cells 100A to 100D arranged in a matrix of 2 rows and 2 columns. The circuit configuration of each of the memory cells 100A to 100D is the same as that of the memory cell illustrated in FIG. 1A. In FIG. 6, a write word line WWL[1] and a read word line RWL[1] for a first row, a write word line WWL[2] and a read word line RWL[2] for a second row, a bit line BL[1] for a first column, a bit line BL[2] for a second column, and a power supply line SL are shown as write word lines WWL, read word lines RWL, bit lines BL, and a power supply line SL.

FIG. 7 shows a timing chart in periods p1 to p8 in which data is written. FIG. 8 shows a timing chart in periods p9 to p16 in which data is read. Note that FIG. 7 and FIG. 8 each show the voltage change of the write word line WWL[1], the write word line WWL[2], the read word line RWL[1], the read word line RWL[2], the power supply line SL, the bit line BL[1], and the bit line BL[2] of FIG. 6.

In the period p1 of FIG. 7, the write word line WWL[1] is set to a high level and the read word line RWL[1] is set to a low level. Note that the other lines, i.e., the write word line WWL[2], the read word line RWL[2], the power supply line SL, the bit line BL[1], and the bit line BL[2] hold their respective voltages which are supplied in the previous period.

In the period p2 of FIG. 7, the bit line BL[1] is supplied with a voltage $V_1$, and the bit line BL[2] is supplied with a voltage $V_2$. Note that the other lines, i.e., the write word line WWL[1], the write word line WWL[2], the read word line RWL[1], the read word line RWL[2], and the power supply line SL hold their respective voltages which are supplied in the previous period.

In the period p3 of FIG. 7, the write word line WWL[1] is set to the low level. Note that the other lines, i.e., the write word line WWL[2], the read word line RWL[1], the read word line RWL[2], the power supply line SL, the bit line BL[1], and the bit line BL[2] hold their respective voltages which are supplied in the previous period.

In the periods p1 to p3, the read word line RWL[1] is set to the low level to prevent the transistor 112 from being turned on by data written to the memory cell. When data is written to the memory cell, the read word line RWL[1] is set to the low level. Thus, after the data is written to the memory cell, the read word line RWL[1] can be changed to the high level. Such a structure allows the potential of the floating node FN in the memory cell to rise after data is written to the memory cell, which can reduce malfunctions in which the p-channel transistor 112 is turned on.

In the period p4 of FIG. 7, the read word line RWL[1] is set to the high level. Further, the bit line BL[1] and the bit line BL[2] are each supplied with an initialization voltage $V_{initial}$. Note that the other lines, i.e., the write word line WWL[1], the write word line WWL[2], the read word line RWL[2], and the power supply line SL hold their respective voltages which are supplied in the previous period.

In the period p5 of FIG. 7, the write word line WWL[2] is set to the high level, and the read word line RWL[2] is set to the low level. Note that the other lines, i.e., the write word line WWL[1], the read word line RWL[1], the power supply line SL, the bit line BL[1], and the bit line BL[2] hold their respective voltages which are supplied in the previous period.

In the period p6 of FIG. 7, the bit line BL[1] is supplied with a voltage $V_2$, and the bit line BL[2] is supplied with a voltage $V_1$. Note that the other lines, i.e., the write word line WWL[1], the write word line WWL[2], the read word line RWL[1], the read word line RWL[2], and the power supply line SL hold their respective voltages which are supplied in the previous period.

In the period p7 of FIG. 7, the write word line WWL[2] is set to the low level. Note that the other lines, i.e., the write word line WWL[1], the read word line RWL[1], the read word line RWL[2], the power supply line SL, the bit line BL[1], and the bit line BL[2] hold their respective voltages which are supplied in the previous period.

In the periods p5 to p7, the read word line RWL[2] is set to the low level to prevent the transistor 112 from being turned on by data written to the memory cell. When data is written to the memory cell, the read word line RWL[2] is set to the low level. Thus, after the data is written to the memory cell, the read word line RWL[2] can be changed to the high level. Such a structure allows the potential of the floating node FN in the memory cell to rise after data is written to the memory cell, which can reduce malfunctions in which the p-channel transistor 112 is turned on.

In the period p8 of FIG. 7, the read word line RWL[2] is set to the high level. Further, the bit line BL[1] and the bit line BL[2] are each supplied with the initialization voltage $V_{initial}$. Note that the other lines, i.e., the write word line WWL[1], the write word line WWL[2], the read word line RWL[1], and the power supply line SL hold their respective voltages which are supplied in the previous period.

As described above, by performing the data writing shown in the periods p1 to p8, data corresponding to the voltage $V_1$ is written to the memory cell 100A shown in FIG. 6, data corresponding to the voltage $V_2$ is written to the memory cell 100B, data corresponding to the voltage $V_2$ is written to the memory cell 100C, and data corresponding to the voltage $V_1$ is written to the memory cell 100D.

In the period p9 of FIG. 8, the bit line BL[1] and the bit line BL[2] are each supplied with a precharge voltage $V_{precharge}$. Note that the other lines, i.e., the write word line WWL[1], the write word line WWL[2], the read word line RWL[1], the read word line RWL[2], and the power supply line SL hold their respective voltages which are supplied in the previous period.

In the period p10 of FIG. 8, the read word line RWL[1] is set to the low level. Thus, the voltages of the bit line BL[1] and the bit line BL[2] are decreased in accordance with voltages corresponding to the data written to the memory cell 100A and the memory cell 100B. Note that the other lines, i.e., the write word line WWL[1], the write word line WWL[2], the read word line RWL[2], and the power supply line SL hold their respective voltages which are supplied in the previous period.

In the period p11 of FIG. 8, the decrease of the voltages of the bit line BL[1] and the bit line BL[2] in the period p10 stops, so that the voltage of the bit line BL[1] and the voltage of the bit line BL[2] become a voltage $V_{1'}$ and a voltage $V_{2'}$, respectively. Note that the other lines, i.e., the write word line WWL[1], the write word line WWL[2], the read word line RWL[1], the read word line RWL[2], and the power supply line SL hold their respective voltages which are supplied in the previous period.

Note that the voltage $V_{1'}$ and the voltage $V_{2'}$ correspond to the voltage $V_1$ and the voltage $V_2$ which are written to the memory cell 100A and the memory cell 100B, respectively, in FIG. 7.

In the period p12 of FIG. 8, the read word line RWL[1] is set to the high level. Note that the other lines, i.e., the write word line WWL[1], the write word line WWL[2], the read word line RWL[2], the power supply line SL, the bit line BL[1], and the bit line BL[2] hold their respective voltages which are supplied in the previous period.

In the period p13 of FIG. 8, the bit line BL[1] and the bit line BL[2] are each supplied with the precharge voltage $V_{precharge}$. Note that the other lines, i.e., the write word line WWL[1], the write word line WWL[2], the read word line RWL[1], the read word line RWL[2], and the power supply line SL hold their respective voltages which are supplied in the previous period.

In the period p14 of FIG. 8, the read word line RWL[2] is set to the low level. Thus, the voltages of the bit line BL[1] and the bit line BL[2] decrease in accordance with a voltage corresponding to the data written to the memory cell 100C and the memory cell 100D. Note that the other lines, i.e., the write word line WWL[1], the write word line WWL[2], the read word line RWL[2], and the power supply line SL hold their respective voltages which are supplied in the previous period.

In the period p15 of FIG. 8, the decrease of the voltages of the bit line BL[1] and the bit line BL[2] in the period p14 stops, and the voltage $V_{2'}$ and the voltage $V_{1'}$ are obtained as the voltage of the bit line BL[1] and the voltage of the bit line BL[2], respectively. Note that the other lines, i.e., the write word line WWL[1], the write word line WWL[2], the read word line RWL[1], the read word line RWL[2], and the power supply line SL hold their respective voltages which are supplied in the previous period.

Note that the voltage $V_{2'}$ and the voltage $V_{1'}$ correspond to the voltage $V_2$ and the voltage $V_1$ which are written to the memory cell 100C and the memory cell 100D, respectively, in FIG. 7.

In the period p16 of FIG. 8, the read word line RWL[2] is set to the high level. Note that the other lines, i.e., the write word line WWL[1], the write word line WWL[2], the read word line RWL[1], the power supply line SL, the bit line BL[1], and the bit line BL[2] hold their respective voltages which are supplied in the previous period.

As described above, by performing the data reading illustrated in the periods p9 to p16, data corresponding to the voltage $V_1$ is read from the memory cell 100A shown in FIG. 6, data corresponding to the voltage V2 is read from the memory cell 100B, data corresponding to the voltage V2 is read from the memory cell 100C, and data corresponding to the voltage $V_1$ is read from the memory cell 100D.

As described above, with the use of the configuration and the operation of the semiconductor device described in this embodiment, multilevel data can be read from the memory cell without switching a signal for reading data in accordance with the number of levels of the multilevel data.

The structure described above in this embodiment can be combined as appropriate with any of the structures described in the other embodiments.

Embodiment 3

In this embodiment, an oxide semiconductor that can be used for the semiconductor layer of the transistor with a low off-state current described in the above embodiments will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, it is possible to use an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios.

When the oxide semiconductor film forming the semiconductor layer contains a large amount of hydrogen, the hydrogen and the oxide semiconductor are bonded to each other, so that part of the hydrogen serves as a donor to cause generation of an electron which is a carrier. As a result, the threshold voltage of the transistor shifts in the negative direction. Therefore, it is preferable that, after the formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, and more preferably less than or equal to $1\times10^{-24}$ A at room temperature (approximately 25° C.); or less than or equal to $1\times10^{-15}$ A, preferably less than or equal to $1\times10^{-18}$ A, and more preferably less than or equal to $1\times10^{-21}$ A at 85° C. Note that the off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

An oxide semiconductor which is formed may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), crystal parts can be found in the CAAC-OS in some cases. In most cases, in an image obtained with a TEM, crystal parts in the CAAC-OS each fit inside a cube whose one side is 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are shown in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has little variation in electrical characteristics and high reliability in some cases. An electrical charge trapped by the trap states in the oxide semiconductor takes a long time to disappear. The trapped electrical charge may behave like a fixed electrical charge. Thus, the transistor which includes the oxide semiconductor having a high density of trap states in the channel formation region has unstable electrical characteristics in some cases.

A transistor using the highly purified intrinsic or substantially highly purified intrinsic CAAC-OS has little variation in the electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 run and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a diameter larger than the diameter of a crystal part (for example, a beam diameter of 20 nmϕ or more, or 50 nmϕ or more). For example, spots are shown in some cases in a nanobeam electron diffraction pattern of the nc-OS obtained by using an electron beam having a diameter smaller than or equal to the diameter of a crystal part (for example, a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be implemented in appropriate combination with any of the other embodiments.

Embodiment 4

In this embodiment, a cross-sectional structure of a transistor included in a memory cell of a semiconductor device of one embodiment of the disclosed invention will be described with reference to drawings.

Figure 9:
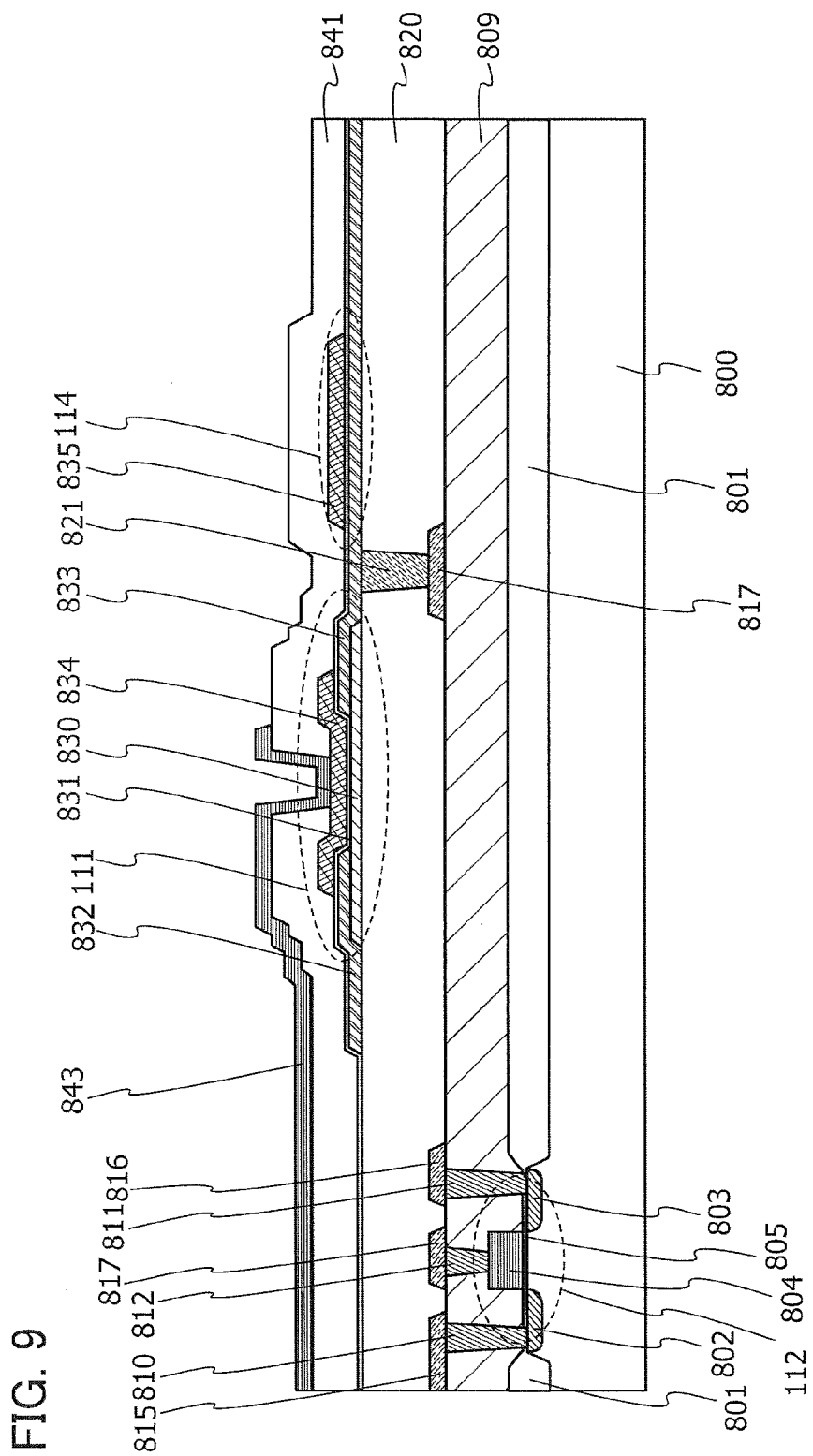
FIG. 9 is a cross-sectional view of a semiconductor device.

FIG. 9 illustrates an example of part of the cross-sectional structure of the memory cell of one embodiment of the present invention. FIG. 9 illustrates the transistor 111, the transistor 112, and the capacitor 114 shown in Embodiment 1.

In this embodiment, the transistor 112 is formed in a single crystal silicon substrate, and the transistor 111 including an oxide semiconductor layer is formed over the transistor 112. The transistor 112 may include a thin semiconductor layer of silicon, germanium, or the like in an amorphous, microcrystalline, polycrystalline, or single crystal state.

In the case where the transistor 112 is formed using a thin silicon film, it is possible to use any of the following: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Among the transistors included in the memory cell of the semiconductor device described in Embodiment 1, the transistor 111 includes an oxide semiconductor and the other transistors such as the transistor 112 include silicon. In that case, the number of transistors using an oxide semiconductor is smaller than that of transistors using silicon. Thus, a stack of the transistor 111 over the transistors using silicon leads to more flexible design rule of the transistor 111.

The chip area of a semiconductor device can be reduced by using such a structure in which a transistor including silicon and a transistor including an oxide semiconductor are stacked. Since the number of transistors including silicon is larger than that of transistors including an oxide semiconductor in one circuit block, the actual chip area of the semiconductor device depends on the number of transistors including silicon.

In FIG. 9, the n-channel transistor 112 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistor 112 is electrically isolated from another transistor by an element isolation insulating film 801. The element isolation insulating film 801 can be formed by a local oxidation of silicon (LOCOS) method, a trench isolation method, or the like.

Specifically, the transistor 112 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor 112. Openings are formed in the insulating film 809. Wirings 810 and 811 that are in contact with the impurity regions 802 and 803, respectively, and a wiring 812 that is in contact with the gate electrode 804 are formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 9, the transistor 111 and the capacitor 114 are formed over the insulating film 820.

The transistor 111 includes, over the insulating film 820, a semiconductor film 830 including an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the conductive film 833 with the gate insulating film 831 positioned therebetween. A portion where the conductive films 833 and 835 overlap with each other with the gate insulating film 831 positioned therebetween functions as the capacitor 114.

Note that in FIG. 9, the capacitor 114 is provided over the insulating film 820 together with the transistor 111. However, the capacitor 114 may be provided below the insulating film 820 together with the transistor 112.

An insulating film 841 is provided over the transistor 111 and the capacitor 114. An opening is provided in the insulating film 841. Over the insulating film 841, a conductive film 843 that is in contact with the gate electrode 834 through the opening is provided.

Note that in FIG. 9, the transistor 111 includes the gate electrode 834 on at least one side of the semiconductor film 830. Alternatively, the transistor 111 may include a pair of gate electrodes with the semiconductor film 830 positioned therebetween.

When the transistor 111 includes a pair of gate electrodes with the semiconductor film 830 positioned therebetween, a signal for controlling on/off may be supplied to one of the gate electrodes, and the other of the gate electrodes may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor 111 can be controlled.

Figure 10A:
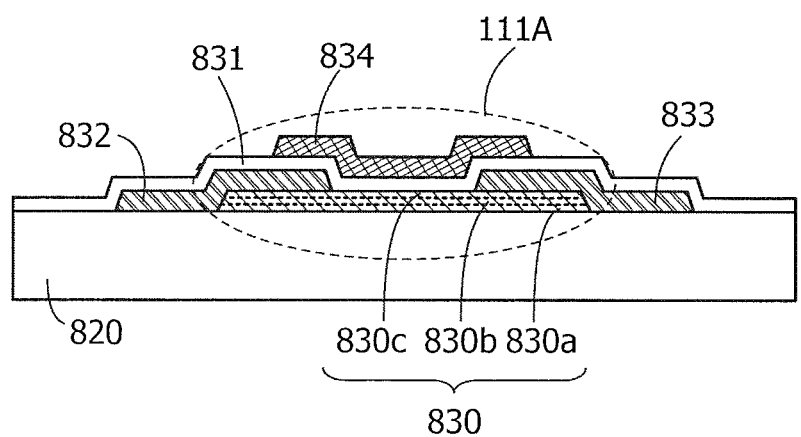
FIGS. 10A and 10B are cross-sectional views of a transistor.
Figure 10B:
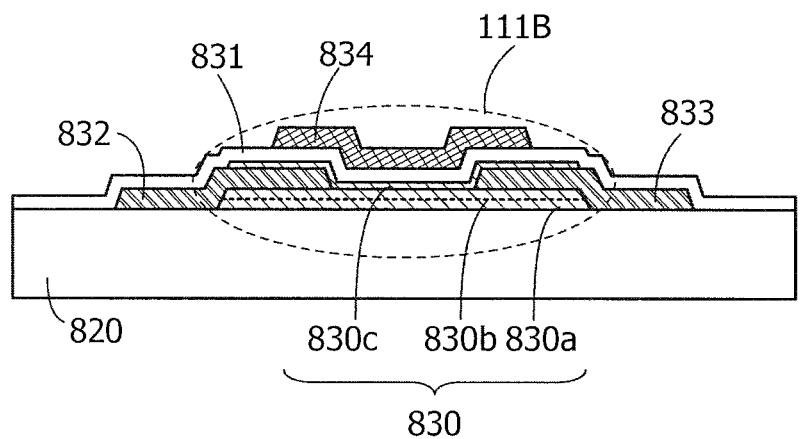

The semiconductor film 830 is not necessarily a single oxide semiconductor film, but may be a stack of a plurality of oxide semiconductor films. FIGS. 10A and 10B illustrate an example in which the semiconductor film 830 is formed using a stack of three oxide semiconductor films.

A transistor 111A in FIG. 10A includes the semiconductor film 830 provided over the insulating film 820 and the like, the conductive films 832 and 833 electrically connected to the semiconductor film 830, the gate insulating film 831, and the gate electrode 834 that is provided over the semiconductor film 830 with the gate insulating film 831 positioned therebetween.

As the semiconductor film 830 in the transistor 111A, oxide semiconductor layers 830a to 830c are stacked sequentially from the insulating film 820 side.

Each of the oxide semiconductor layers 830a and 830c is an oxide film that contains at least one of metal elements contained in the oxide semiconductor layer 830b and in which energy at the bottom of the conduction band is closer to the vacuum level than that in the oxide semiconductor layer 830b by higher than or equal to 0.05 eV, 0.07 eV, 0.1 eV, or 0.15 eV and lower than or equal to 2 eV, 1 eV, 0.5 eV, or 0.4 eV. The oxide semiconductor layer 830b preferably contains at least indium because carrier mobility is increased.

Note that as illustrated in a transistor 111B in FIG. 10B, the oxide semiconductor layer 830c may be provided over the conductive films 832 and 833 to overlap with the gate insulating film 831.

This embodiment can be implemented in appropriate combination with any of the other embodiments.

Embodiment 5

In this embodiment, application examples of the semiconductor device described in the above embodiments to an electronic component and to an electronic device including the electronic component will be described with reference to FIGS. 11A and 11B and FIGS. 12A to 12E.

Figure 11A:
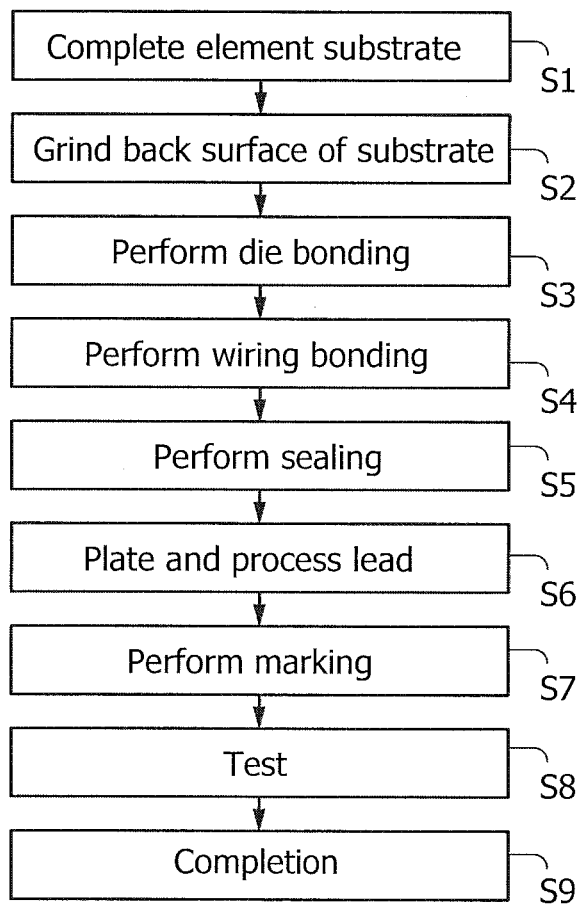
FIGS. 11A and 11B are a flow chart illustrating steps of manufacturing a semiconductor device and a schematic perspective view of the semiconductor device.

FIG. 11A shows an example where the semiconductor device described in the above embodiments is used to make an electronic component. Note that the electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 9 in Embodiment 4 undergoes the assembly process (post-process) to be completed in combination with components detachable to a printed circuit board.

The post-process can be completed through steps shown in FIG. 11A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step is performed to grind the back surface of the substrate to separate the substrate into a plurality of chips. Then, a die bonding step is performed so that separate chips are individually picked up to be mounted on and bonded to a lead frame (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component includes the semiconductor device described in the above embodiments. It is thus possible to achieve an electronic component including a memory cell from which multilevel data can be read without switching a signal for reading data in accordance with the number of levels of the multilevel data. The electronic component includes the semiconductor device provided with the memory cell from which multilevel data can be read without switching a signal for reading data in accordance with the number of levels of the multilevel data, and accordingly, the reading operation is performed at high speed in the electronic component.

Figure 11B:
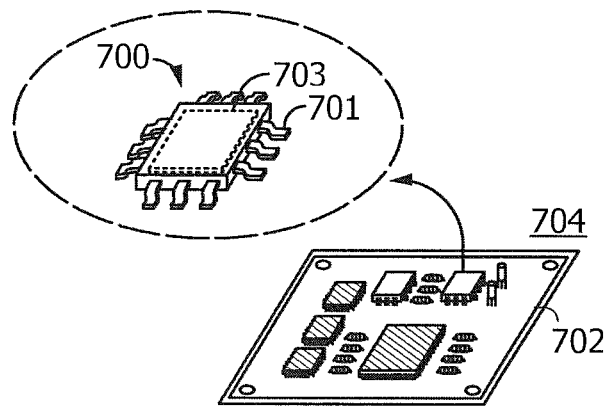

FIG. 11B is a perspective schematic view of a completed electronic component. FIG. 11B shows a perspective schematic view of a quad flat package (QFP) as an example of the electronic component. An electronic component 700 illustrated in FIG. 11B includes a lead 701 and a semiconductor device 703. The electronic component 700 in FIG. 11B is mounted on a printed wiring board 702, for example. The plurality of electronic components 700 are used in combination to be electrically connected to each other over the printed wiring board 702; thus, a circuit board on which the electronic components are mounted (a circuit board 704) is completed. The completed circuit board 704 is provided in an electronic device or the like.

Next, description is made on applications of the aforementioned electronic component to an electronic device such as a computer, a portable information terminal (including a cellular phone, a portable game machine, an audio reproducing device, and the like), electronic paper, a television device (also referred to as a television or a television receiver), or a digital video camera.

Figure 12A:
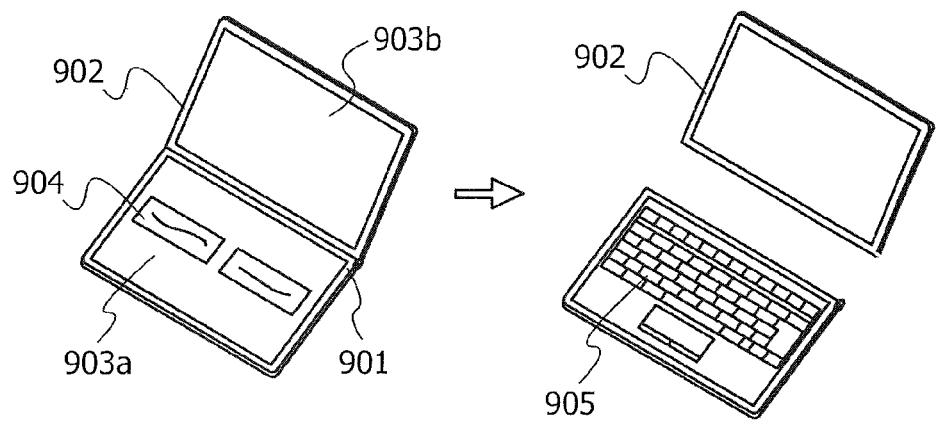
FIGS. 12A to 12E are diagrams each illustrating an electronic device including a semiconductor device.

FIG. 12A illustrates a portable information terminal, which includes a housing 901, a housing 902, a first display portion 903a, a second display portion 903b, and the like. At least one of the housings 901 and 902 includes a circuit board including the semiconductor device described in the above embodiments. It is thus possible to achieve a portable information terminal in which the reading operation is performed at high speed.

Note that the first display portion 903a is a touch panel, and for example, as illustrated in the left of FIG. 12A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "touch input" is selected, for example, a keyboard 905 is displayed on the first display portion 903a as illustrated in the right of FIG. 12A. With the keyboard 905, letters can be input quickly by keyboard input as in the case of using a conventional information terminal, for example.

Further, one of the first display portion 903a and the second display portion 903b can be detached from the portable information terminal as illustrated in the right of FIG. 12A. When the first display portion 903a has a touch input function, the information terminal has a further reduced weight and thus is easy to carry, which is convenient because operation with one hand is enabled while the other hand supports the housing 902.

The portable information terminal illustrated in FIG. 12A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Further, an external connection terminal (e.g., an earphone terminal or a USB terminal), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an electronic book server.

Further, the housing 902 illustrated in FIG. 12A may have an antenna, a microphone function, or a wireless communication function to be used as a cellular phone.

Figure 12B:
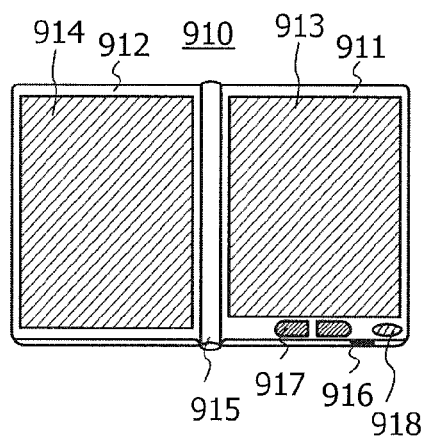

FIG. 12B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. At least one of the housings 911 and 912 includes a circuit board including the semiconductor device described in the above embodiments. It is thus possible to achieve an e-book reader in which the reading operation is performed at high speed.

Figure 12C:
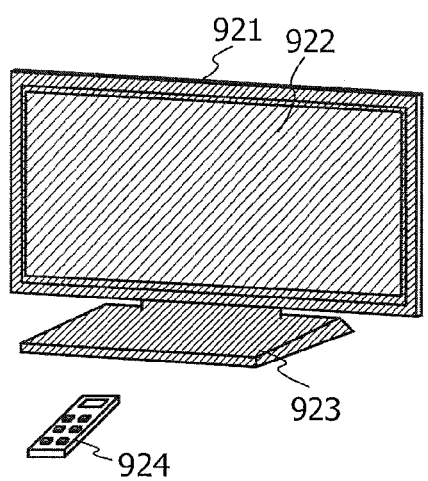

FIG. 12C is a television device, which includes a housing 921, a display portion 922, a stand 923, and the like. The television device 920 can be operated with a switch of the housing 921 and a remote control 924. The housing 921 and the remote control 924 include a circuit board including the semiconductor device described in the above embodiments. It is thus possible to achieve a television device in which the reading operation is performed at high speed.

Figure 12D:
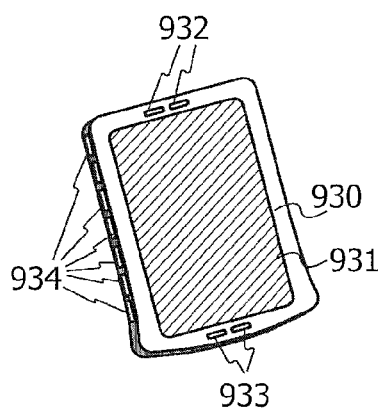

FIG. 12D illustrates a smartphone in which a main body 930 includes a display portion 931, a speaker 932, a microphone 933, operation buttons 934, and the like. The main body 930 includes a circuit board including the semiconductor device described in the above embodiments. It is thus possible to achieve a smartphone in which the reading operation is performed at high speed.

Figure 12E:
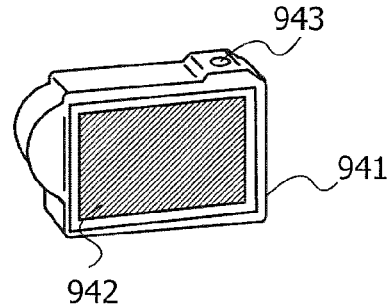

FIG. 12E illustrates a digital camera, which includes a main body 941, a display portion 942, an operation switch 943, and the like. The main body 941 includes a circuit board including the semiconductor device described in the above embodiments. It is thus possible to achieve a digital camera which has a reduced size, weight, or power consumption.

As described above, the electronic devices shown in this embodiment each include a circuit board including the semiconductor device of the above embodiments. It is thus possible to achieve electronic devices in which the reading operation is performed at high speed.

Example

A 3 bit/cell semiconductor device was fabricated to demonstrate writing and reading of multilevel data. Reported in this example are time for writing multilevel data, rewrite endurance, and the operations of writing and reading of multilevel data.

Figure 13A:
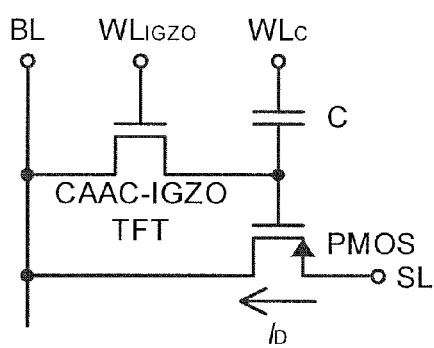
FIG. 13A is a circuit diagram of a memory cell.

A memory cell included in the semiconductor device is a memory that employs CAAC-IGZO TFTs having a feature of an extremely low off-state leakage current on the order of yoctoamperes (yA ("y" is $10^{-24}$)) per micrometer. FIG. 13A is a circuit diagram of the memory cell. The memory cell is composed of a CAAC-IGZO TFT (first transistor) used for writing data, a PMOS (second transistor) used for reading data, and a cell capacitor C (capacitor) for accumulating electrical charge and controlling the gate voltage of the PMOS. A prototype in this example includes the memory cell fabricated in the 0.45-μm CMOS and 0.45-μm CAAC-IGZO TFT technology. The cell capacitor C had a capacitance of 2 fF.

Figure 13B:
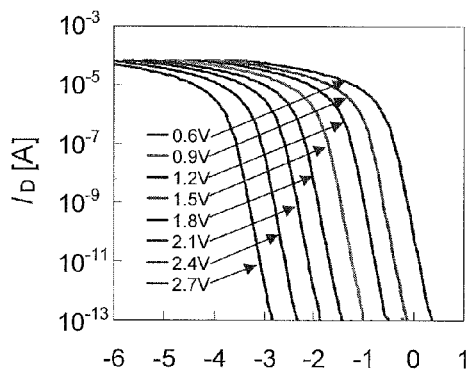
FIG. 13B shows $I_D$-$V_{WLC}$ characteristics at the time of writing of 8-level data to the memory cell.

FIG. 13B is a graph showing the current-voltage characteristics in which the vertical axis is reading current $I_D$ and the horizontal axis is the voltage of read word line ($WL_C$), in the case of writing eight levels of voltages (0.6 V, 0.9 V, 1.2 V, 1.5 V, 1.8 V, 2.1 V, 2.4 V, and 2.7 V) to the prototype memory cell. The graph shows that the characteristics of the reading current $I_n$ shift on the basis of the voltage written to the memory cell.

Figure 13C:
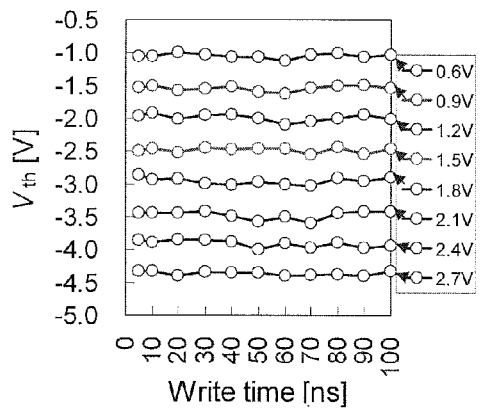
FIG. 13C shows the relationship between $V_{th}$ and a write time of the memory cell.

FIG. 13C is a graph showing the relation between threshold voltage ($V_{th}$) calculated from the characteristic curves in FIG. 13B and the write time of the memory cell. The cell is found to store any of the eight levels of voltages in the cell capacitor C within a write time of 5 ns.

Figure 13D:
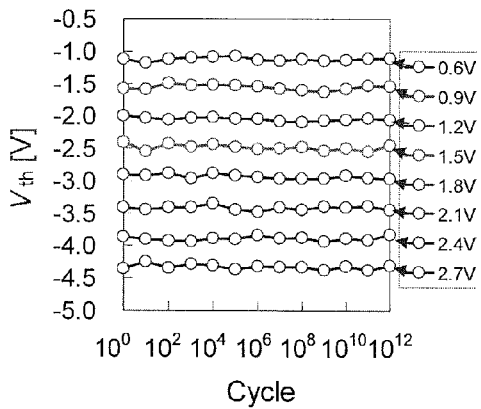
FIG. 13D shows rewrite endurance of the memory cell.

FIG. 13D shows the rewrite endurance of the memory cell. The cell is found to keep $V_{th}$ corresponding to the eight levels of voltages even after $10^{12}$ cycles.

These results show that the memory cell including two transistors and one capacitor is suitable for holding multilevel data. To read data from the fabricated memory cell, potential of a bit line (BL) was precharged, and then electrical charge of the bit line (BL) was discharged to a power supply line (SL). At this time, the electrical charge of the BL was discharged until the voltage of the BL reaches a certain level. The voltage at the certain level is defined as the cell threshold voltage of the memory cell. The cell threshold voltage is determined by the amount of electrical charge accumulated in the cell capacitor C.

Figure 14:
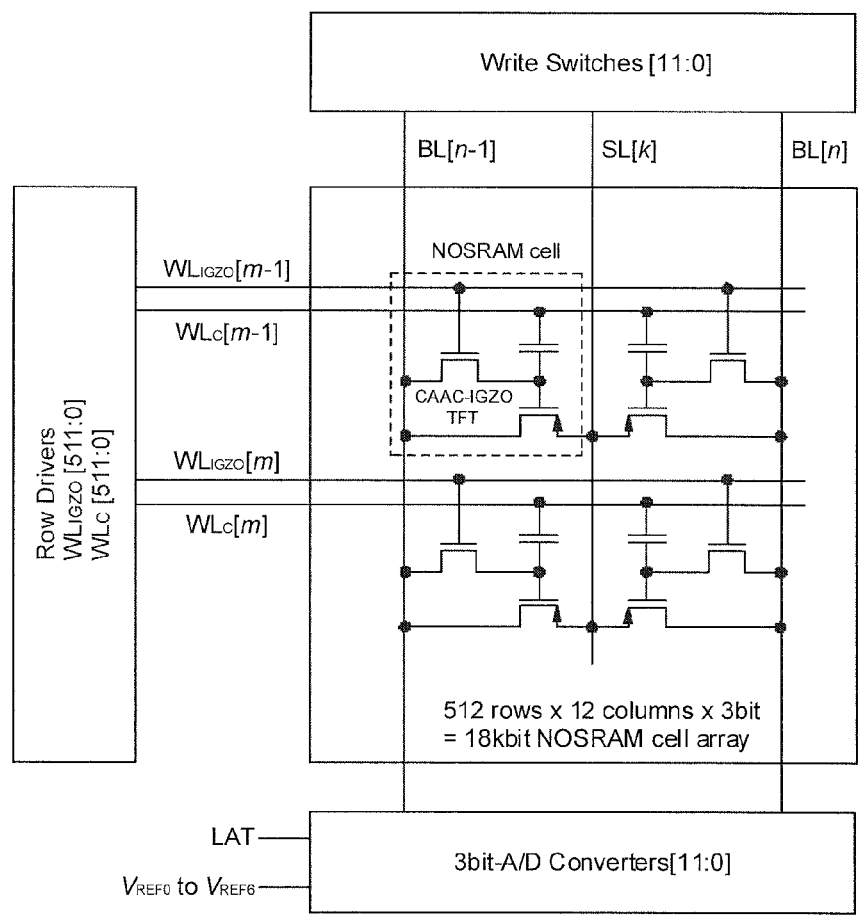
FIG. 14 is a block diagram of a semiconductor device.

FIG. 14 is a block diagram of a semiconductor device including the fabricated memory cell. The semiconductor device includes a memory cell array, write switches, row drivers, and 3 bit A/D converters (ADCs).

Figure 15:
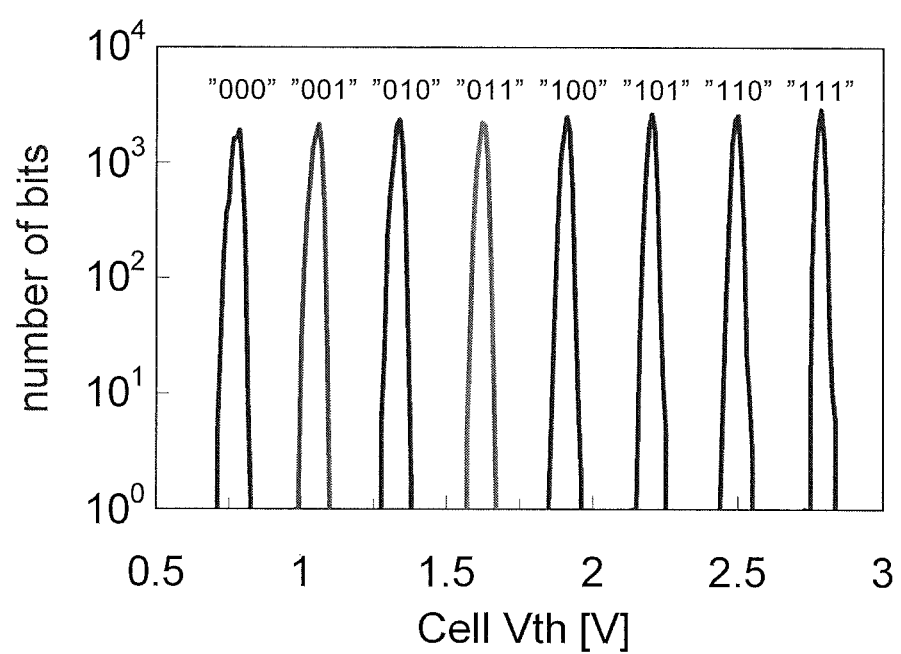
FIG. 15 shows distributions of data of a 3 bit/cell memory cell.

FIG. 15 shows the distributions of the cell threshold voltages in the memory cell. From FIG. 15, it is found that the distributions of eight levels of voltages do not overlap, that is, are separated.

To read eight levels of data, 3 bit ADCs are needed. The 3 bit ADCs in the fabricated semiconductor device are flash ADCs each including seven comparator arrays and one encoder.

Figure 16:
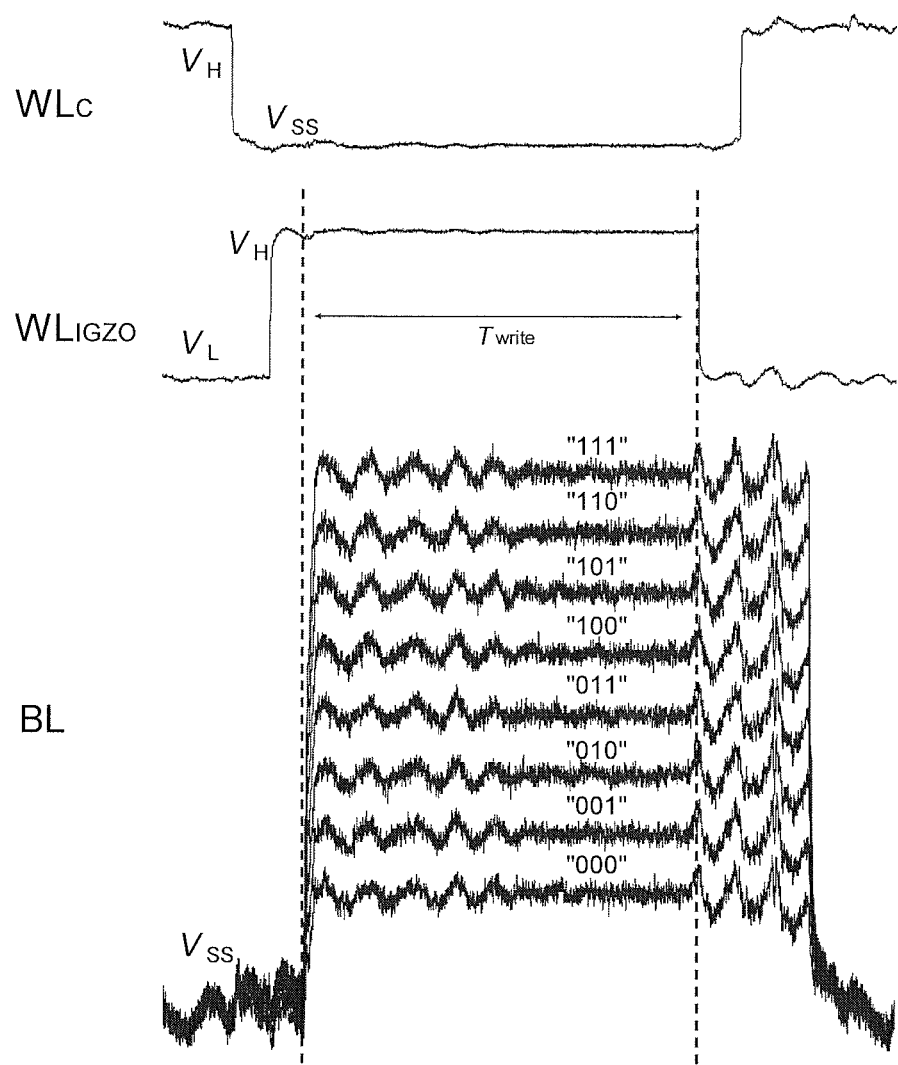
FIG. 16 shows reading waveforms.

The operations of the semiconductor device are described below. Power supply voltage $V_{DD}$ of the semiconductor device was set to 3 V. FIG. 16 shows waveforms in writing operation for the memory cell. In writing operation, first, power supply voltages $V_{SS}$ and $V_H$ were applied to a $WL_C$ and a write word line ($WL_{IGZO}$) in a selected row, respectively. The voltage $V_H$ was set to 4.5 V for cancelling $V_{th}$ drops in the CAAC-IGZO TFTs. Next, eight levels of voltages corresponding to 3-bit data were selected through the write switches to be output to the BL. The voltage applied to the BL can be directly applied across cell capacitors C in memory cells in the selected row. Accordingly, 3-bit data can be collectively written in row unit.

A write voltage corresponding to 3-bit data "111" was set to 2.7 V, a write voltage corresponding to 3-bit data "110" was set to 2.4 V, and write voltages corresponding to the remaining data were set to 2.1 V, 1.8 V, 1.5 V, 1.2 V, 0.9 V, and 0.6 V. Lastly, $V_L$ and $V_H$ were applied to $WL_{IGZO}$ and $WL_C$ in the selected row, respectively, to complete the writing operation.

The voltage $V_L$ was set to −1 V so that the CAAC-IGZO TFTs were turned off to retain data. In the fabricated semiconductor device, a write time $T_{write}$ is a time from application of a write voltage to the BL to application of $V_L$ to the $W_{LIGZO}$. FIG. 17A is a graph showing the relationship between $T_{write}$ and the peak of cell threshold voltage. FIG. 17B is a graph showing the relationship between $T_{write}$ and standard deviation of a cell threshold voltage. It is found that a 100-ns $T_{write}$ of the fabricated semiconductor device results in convergence of 6σ and separated distributions of $V_{th}$ of the memory cell.

The write time is shorter than the write time of a conventional semiconductor device before. Table 1 shows voltages for writing data, the peaks of cell threshold voltages, and 6σ.

TABLE 1

| Data | 000 | 001 | 010 | 011 | 100 | 101 | 110 | 111 |
|---|---|---|---|---|---|---|---|---|
| Write Voltage[V] | 0.6 | 0.9 | 1.2 | 1.5 | 1.8 | 2.1 | 2.4 | 2.7 |
| Peak of Cell $V_{th}$[V] | 0.79 | 1.06 | 1.34 | 1.62 | 1.91 | 2.20 | 2.50 | 2.79 |
| 6σ[V] | 0.109 | 0.098 | 0.086 | 0.084 | 0.080 | 0.074 | 0.074 | 0.070 |

The number of cells outside 6σ is 0.002 ppm, which means that memory having a capacity of approximately 0.1 Gb needs no verify operation.

Figure 18A:
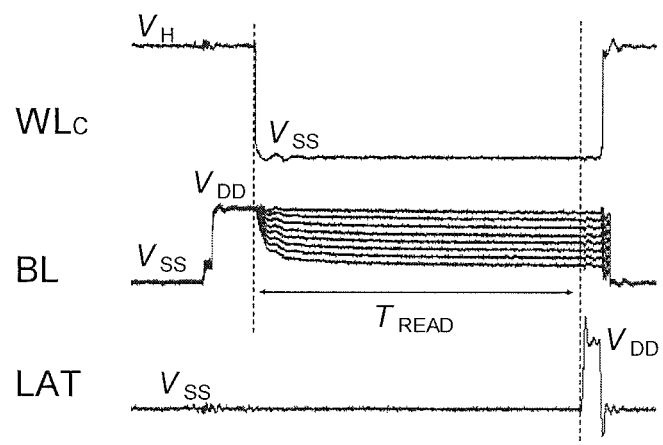
FIG. 18A shows reading waveforms.
Figure 18B:
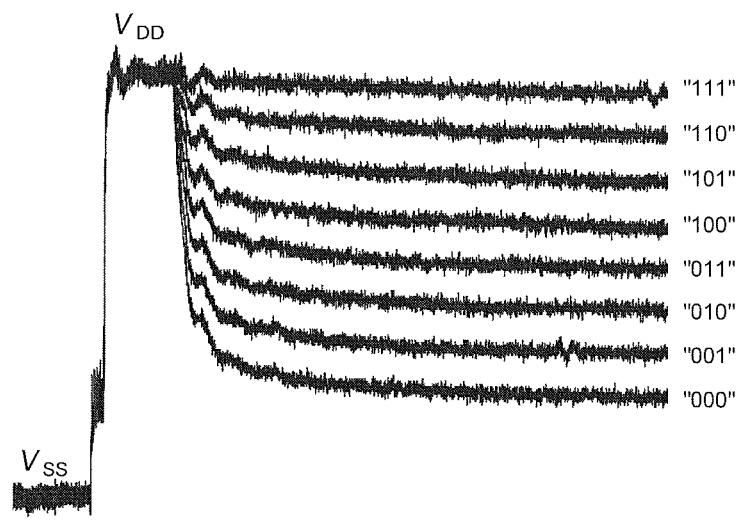
FIG. 18B shows enlarged BL reading waveforms.

FIG. 18A shows waveforms in reading operation for the fabricated semiconductor device. FIG. 18B shows the enlarged waveform of the BL in FIG. 18A. In reading operation, first, $V_{DD}$ was precharged to the BL and $V_{SS}$ was applied to the SL. Then, $V_{SS}$ was applied to the $WL_C$ in the selected row. The electrical charge of the BL was discharged until the voltage of the BL which was precharged was decreased to the cell threshold voltage of each memory cell. The voltage of the BL which was discharged was converted into 3-bit data by the 3 bit ADC. The output 3-bit data were sampled with a LAT signal and $V_H$ was applied to $WL_C$ to complete the reading operation.

In this way of reading data, the distributions of $V_{th}$ of PMOS in memory cells are determined on the basis of variations in $V_{th}$ of PMOS in memory cells and variations in write voltage. The voltage of the BL is applied across the cell capacitor C as write voltage to the memory cell, and therefore, expansion of the distribution of cell threshold voltages can be prevented.

In the fabricated semiconductor device, a read time $T_{READ}$ is a time from application of $V_{SS}$ to $WL_C$ to obtaining of data with a LAT signal. It is demonstrated that multilevel data can be collectively read in parallel in $T_{READ}$ of a 900-ns. The read time $T_{READ}$ of this semiconductor device is approximately the same as the read time of a binary semiconductor device.

Figure 19:
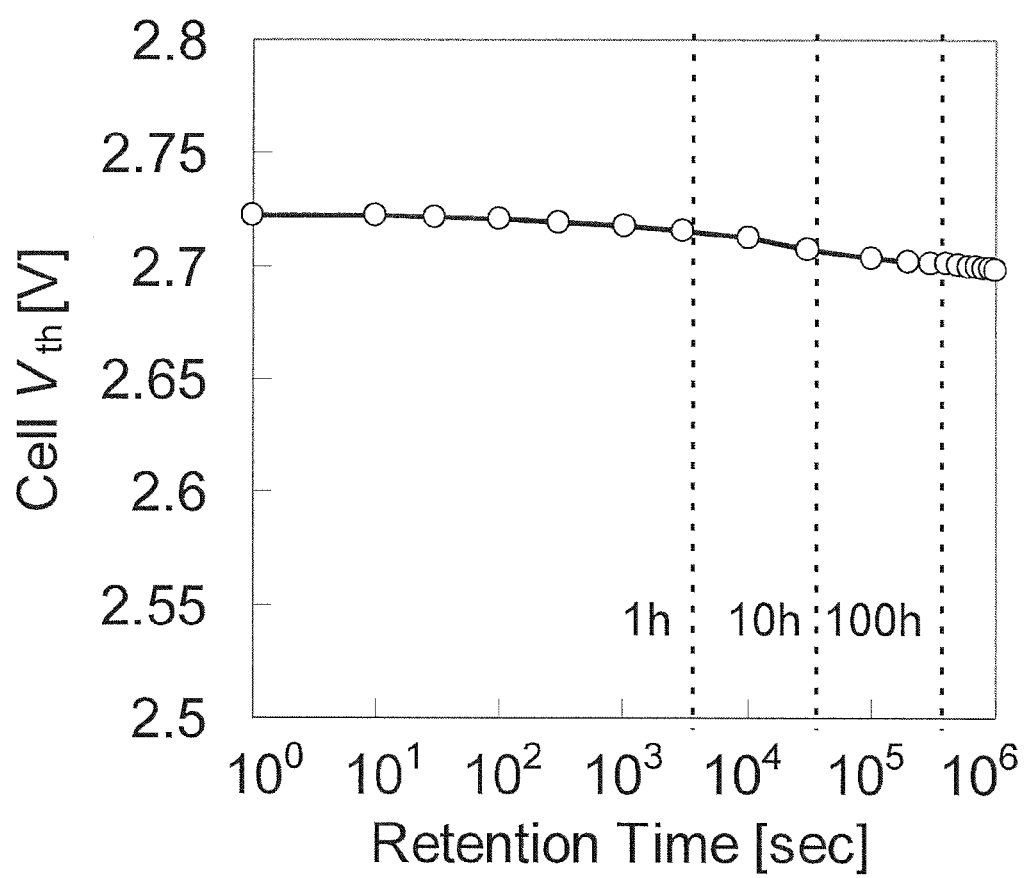
FIG. 19 shows retention.

FIG. 19 shows retention characteristics at 27° C. Measuring retention of data "111" gives the following results. A decrease in cell threshold voltage is found to be approximately 25 mV in 278-hour retention. A voltage between the peaks of cell threshold voltages of data is 300 my. The value 6σ of cell threshold voltage is 110 mV. The error in the 3 bit ADC is 10 mV. Therefore, the retention margin is 60 mV. Data are estimated to be retained for approximately 27 days.

Figure 20:
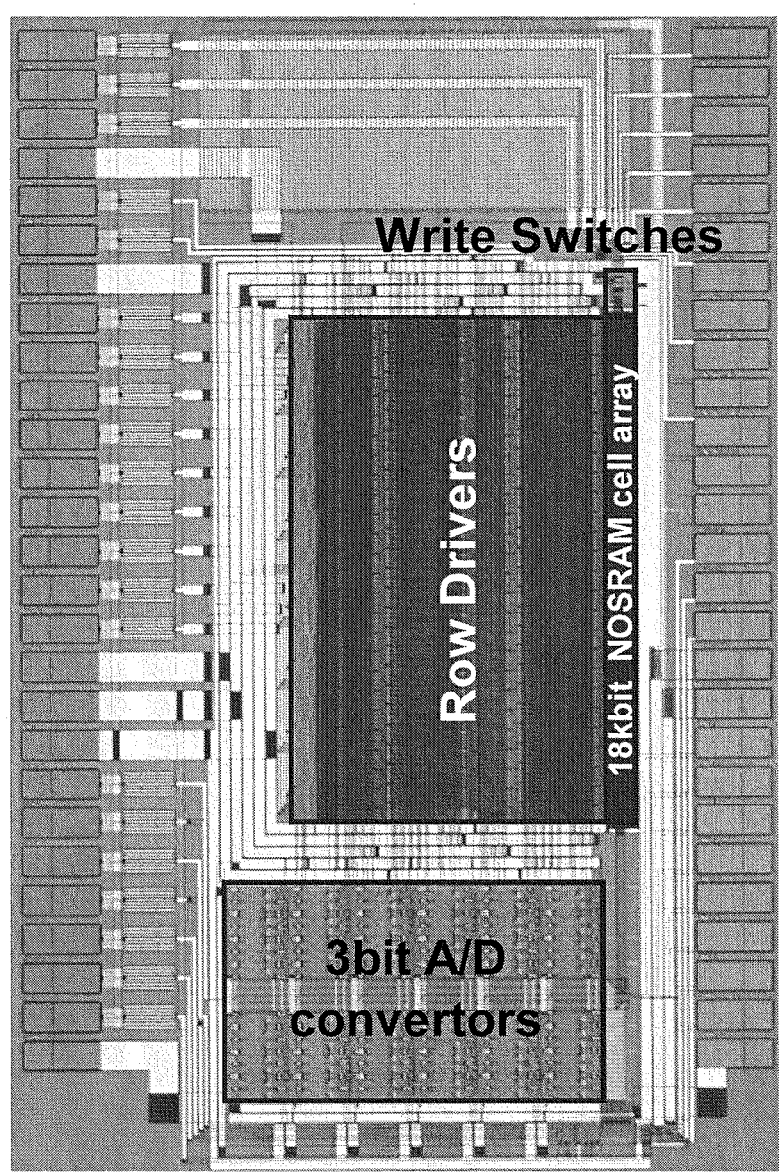
FIG. 20 is a photograph of a semiconductor device.

FIG. 20 is a photograph of the fabricated semiconductor device. Table 2 is the specification of the fabricated semiconductor device.

TABLE 2

| Bits per Cell | 3 |
|---|---|
| Density | 18k bit |
| Technology | 0.45-μm CMOS |
|  | 0.45-μm CAAC-IGZO TFT |
| Cell Array | 512 rows × 12 columns |
| Write Performance | 100 ns |
| Read Performance | 900 ns |
| Power Supply | VDD/VH/VL = 3 V/4.5 V/−1 V |

In this example, the 3 bit/cell semiconductor device including a CAAC-IGZO TFT was fabricated. In the fabricated semiconductor device, it is demonstrated that 3-bit data can be written in parallel in 100 ns. In the distribution of cell threshold voltages of data, 6σ is not higher than 110 mV in the case of a writing operation with no verify operation. This means that distributions of cell threshold voltages can be separated even when the capacity of the memory cell is increased.

REFERENCE NUMERALS p1: period, 2: period, p3: period, p4: period, p5: period, p6: period, p7: period, p8: period, p9: period, p10: period, p11: period, p12: period, p13: period, p14: period, p15: period, p16: period, T0: period, T1: period, T2: period, $V_0$: potential, $V_7$: potential, $V_{ref0}$: reference voltage, $V_{ref6}$: reference voltage, 100: memory cell, 100A: memory cell, 100B: memory cell, 100C: memory cell, 100D: memory cell, 111: transistor, 111A: transistor, 111B: transistor, 112: transistor, 114: capacitor, 200: semiconductor device, 201: memory cell array, 202: row driver, 203: column driver, 204: A/D converter, 301: decoder, 302: controller, 401: decoder, 402: latch, 403: D/A converter, 404: switch circuit, 405: transistor, 406: transistor, 501: comparator, 502: encoder, 503: latch, 504: buffer, 600: semiconductor device, 700: electronic component, 701: lead, 702: printed wiring board, 703: semiconductor device, 704: completed circuit board, 800: semiconductor substrate, 801: element isolation insulating film, 802: impurity region, 803: impurity region, 804: gate electrode, 805: gate insulating film, 809: insulating film, 810: wiring, 811: wiring, 812: wiring, 815: wiring, 816: wiring, 817: wiring, 820: insulating film, 821: wiring, 830: semiconductor film, 830a: oxide semiconductor layer, 830b: oxide semiconductor layer, 830c: oxide semiconductor layer, 831: gate insulating film, 832: conductive film, 833: conductive film, 834: gate electrode, 835: conductive film, 841: insulating film, 843: conductive film, 901: housing, 902: housing, 903a: display portion, 903b: display portion, 904: selection button, 905: keyboard, 910: e-book reader, 911: housing, 912: housing, 913: display portion, 914: display portion, 915: hinge, 916: power button, 917: operation key, 918: display portion, 920: television device, 921: housing, 922: display portion, 923: stand, 924: remote control, 930: main body, 931: display portion, 932: main body, 933: microphone, 934: operation button, 941: main body, 942: display portion, 943: operation switch.

This application is based on Japanese Patent Application serial no. 2013-051141 filed with Japan Patent Office on Mar. 14, 2013, the entire contents of which are hereby incorporated by reference.

The invention claimed is:
1. A semiconductor device comprising:
 a memory cell comprising:
  a first transistor;
  a second transistor; and
  a capacitor; and
 an A/D converter,
 wherein the first transistor comprises a channel formation region comprising an oxide semiconductor,
 wherein one of a source and a drain of the first transistor is electrically connected to a gate of the second transistor,
 wherein the other of the source and the drain of the first transistor is electrically connected to a bit line,
 wherein one of a source and a drain of the second transistor is electrically connected to the bit line, wherein the other of the source and the drain of the second transistor is electrically connected to a power supply line, wherein the gate of the second transistor is electrically connected to a first electrode of the capacitor, wherein a second electrode of the capacitor is electrically connected to a read word line, and wherein the bit line is electrically connected to the A/D converter.

2. The semiconductor device according to claim 1, wherein the second transistor comprises a channel formation region comprising silicon.

3. The semiconductor device according to claim 1, wherein the A/D converter comprises a comparator configured to compare a potential of the bit line and a reference voltage.

4. The semiconductor device according to claim 1, wherein the A/D converter is configured to determine which data of multilevel data a potential of the bit line corresponds to.

5. A semiconductor device comprising:
a column driver;
a row driver;
a memory cell array comprising:
    a memory cell comprising:
        a first transistor;
        a second transistor; and
        a capacitor; and
an A/D converter,
wherein the first transistor comprises a channel formation region comprising an oxide semiconductor,
wherein one of a source and a drain of the first transistor is electrically connected to a gate of the second transistor,
wherein the other of the source and the drain of the first transistor is electrically connected to a bit line,
wherein one of a source and a drain of the second transistor is electrically connected to the bit line,
wherein the other of the source and the drain of the second transistor is electrically connected to a power supply line,
wherein the gate of the second transistor is electrically connected to a first electrode of the capacitor,
wherein a second electrode of the capacitor is electrically connected to a read word line,
wherein the read word line is electrically connected to the row driver,
wherein the bit line is electrically connected to the column driver, and
wherein the bit line is electrically connected to the A/D converter.

6. The semiconductor device according to claim 5, wherein the second transistor comprises a channel formation region comprising silicon.

7. The semiconductor device according to claim 5, wherein the A/D converter comprises a comparator configured to compare a potential of the bit line and a reference voltage.

8. The semiconductor device according to claim 5, wherein the A/D converter is configured to determine which data of multilevel data a potential of the bit line corresponds to.

9. A semiconductor device comprising:
a column driver;
a row driver;
a memory cell array comprising:
    a memory cell comprising:
        a first transistor;
        a second transistor; and
        a capacitor; and
an A/D converter,
wherein the first transistor comprises a channel formation region comprising an oxide semiconductor,
wherein the first transistor is over an insulating film,
wherein the second transistor is below the insulating film,
wherein one of a source and a drain of the first transistor is electrically connected to a gate of the second transistor,
wherein the other of the source and the drain of the first transistor is electrically connected to a bit line,
wherein one of a source and a drain of the second transistor is electrically connected to the bit line,
wherein the other of the source and the drain of the second transistor is electrically connected to a power supply line,
wherein the gate of the second transistor is electrically connected to a first electrode of the capacitor,
wherein a second electrode of the capacitor is electrically connected to a read word line,
wherein the read word line is electrically connected to the row driver,
wherein the bit line is electrically connected to the column driver, and
wherein the bit line is electrically connected to the A/D converter.

10. The semiconductor device according to claim 9, wherein the second transistor comprises a channel formation region comprising silicon.

11. The semiconductor device according to claim 9, wherein the A/D converter comprises a comparator configured to compare a potential of the bit line and a reference voltage.

12. The semiconductor device according to claim 9, wherein the A/D converter is configured to determine which data of multilevel data a potential of the bit line corresponds to.

* * * * *